(12) United States Patent
Luo et al.

(10) Patent No.: US 11,800,706 B2
(45) Date of Patent: Oct. 24, 2023

(54) INTEGRATED ASSEMBLIES HAVING CONDUCTIVE POSTS EXTENDING THROUGH STACKS OF ALTERNATING MATERIALS

(71) Applicant: Micron Technology, Inc., Boise, ID (US)

(72) Inventors: Shuangqiang Luo, Boise, ID (US); Indra V. Chary, Boise, ID (US); Justin B. Dorhout, Boise, ID (US); Rita J. Klein, Boise, ID (US)

(*) Notice: Subject to any disclaimer, the term of this patent is extended or adjusted under 35 U.S.C. 154(b) by 166 days.

(21) Appl. No.: 17/395,751

(22) Filed: Aug. 6, 2021

(65) Prior Publication Data

US 2021/0375894 A1 Dec. 2, 2021

Related U.S. Application Data

(62) Division of application No. 16/422,150, filed on May 24, 2019, now Pat. No. 11,121,143.

(51) Int. Cl.
| | | |
|---|---|---|
| H10B 41/41 | (2023.01) | |
| G11C 5/06 | (2006.01) | |
| H10B 41/27 | (2023.01) | |
| H10B 41/35 | (2023.01) | |
| H10B 43/27 | (2023.01) | |

(Continued)

(52) U.S. Cl.
CPC ............. *H10B 41/41* (2023.02); *G11C 5/063* (2013.01); *H10B 41/27* (2023.02); *H10B 41/35* (2023.02); *H10B 43/27* (2023.02); *H10B 43/35* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 7,983,065 B2 | 7/2011 | Samachisa | |
| 8,466,068 B2 | 6/2013 | Scheuerlein | |

(Continued)

FOREIGN PATENT DOCUMENTS

| | | |
|---|---|---|
| JP | 2018-026518 | 2/2018 |
| KR | 10-2017-0093099 | 8/2017 |

(Continued)

OTHER PUBLICATIONS

EP EP 20812746 Supp Search Rept, dated Jun. 27, 2022, Micron Technology, Inc.

(Continued)

*Primary Examiner* — Sarah K Salerno
(74) *Attorney, Agent, or Firm* — Brooks, Cameron & Huebsch, PLLC

(57) ABSTRACT

Some embodiments include an integrated assembly having a conductive expanse over conductive nodes. The conductive nodes include a first composition. A bottom surface of the conductive expanse includes a second composition which is different composition than the first composition. A stack is over the conductive expanse. The stack includes alternating first and second levels. Pillar structures extend vertically through the stack. Each of the pillar structures includes a post of conductive material laterally surrounded by an insulative liner. At least one of the posts extends through the conductive expanse to directly contact one of the conductive nodes. Some embodiments include methods of forming integrated assemblies.

17 Claims, 35 Drawing Sheets

(51) Int. Cl.
  *H10B 43/35* (2023.01)
  *H10B 43/40* (2023.01)

(56) References Cited

U.S. PATENT DOCUMENTS

| | | |
|---|---|---|
| 9,355,757 B2 | 5/2016 | Zhang et al. |
| 9,576,971 B2 | 2/2017 | Zhang et al. |
| 10,115,730 B1 | 10/2018 | Baraskar et al. |
| 10,354,980 B1 | 7/2019 | Mushiga et al. |
| 10,355,007 B2 | 7/2019 | Zhang et al. |
| 2014/0061747 A1 | 3/2014 | Tanzawa et al. |
| 2015/0129878 A1 | 5/2015 | Shin et al. |
| 2015/0279857 A1 | 10/2015 | Kim et al. |
| 2016/0163389 A1 | 6/2016 | Zhang et al. |
| 2016/0163729 A1 | 6/2016 | Zhang et al. |
| 2016/0329101 A1 | 11/2016 | Sakakibara |
| 2017/0018555 A1 | 1/2017 | Kwan et al. |
| 2017/0047334 A1 | 2/2017 | Lu et al. |
| 2017/0062454 A1 | 3/2017 | Lu et al. |
| 2017/0069731 A1 | 3/2017 | Kim et al. |
| 2017/0098655 A1 | 4/2017 | Zhang et al. |
| 2017/0125430 A1 | 5/2017 | Nishikawa et al. |
| 2017/0243651 A1 | 8/2017 | Choi |
| 2017/0338241 A1 | 11/2017 | Lee |
| 2018/0047744 A1 | 2/2018 | Utsumi |
| 2018/0277596 A1 | 9/2018 | Mori |
| 2019/0074249 A1 | 3/2019 | Sasaki |

FOREIGN PATENT DOCUMENTS

| | | |
|---|---|---|
| TW | 200943491 | 10/2009 |
| TW | 201106360 | 2/2011 |
| WO | WO 2014/036294 | 3/2014 |
| WO | WO 2019/050714 | 3/2019 |

OTHER PUBLICATIONS

WO PCT/US2020/029130 Search Rept., dated Jul. 31, 2020, Micron Technology, Inc.
WO PCT/US2020/029130 Writ. Opin., dated Jul. 31, 2020, Micron Technology, Inc.
TW TW 109115532 SR Translation, dated Apr. 8, 2021, Micron Technology, Inc.
WO PCT/US2020/029130 IPRP, dated Nov. 16, 2021, Micron Technology, Inc.

INTEGRATED ASSEMBLIES HAVING CONDUCTIVE POSTS EXTENDING THROUGH STACKS OF ALTERNATING MATERIALS

RELATED PATENT DATA

This patent resulted from a divisional of U.S. patent application Ser. No. 16/422,150 filed May 24, 2019, which is hereby incorporated by reference herein.

TECHNICAL FIELD

Integrated assemblies (e.g., NAND assemblies) having conductive posts extending through stacks of alternating materials (e.g., alternating levels of wordline material and insulative material).

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_1$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include methods of forming pillar structures through a stack of alternating levels. Every other level of the stack may be eventually replaced with conductive material to form wordline levels of a NAND assembly. Portions of the stack may be comprised by a memory region, a staircase region peripheral to the memory array region, and another region peripheral to the memory array region. Each of the pillar structures may include a conductive post. The pillar structures extending through the staircase region of the stack may be for support rather than for electrical connectivity, whereas the pillar structures extending through the other regions of the stack may be for electrical connectivity. Some embodiments include methods of forming the posts to be of a same highly-conductive material as conductive nodes under the stack, and of forming the posts to directly contact such conductive nodes to achieve low resistance (i.e., high conductivity) from the nodes to the posts for those posts utilized in pillar structures provided for electrical connectivity. Some embodiments include methods of protecting against over-penetration of the conductive posts into underlying materials for those posts utilized in pillar structures provided primarily as structural supports. Example embodiments are described with reference to FIGS. 5-34.

FIGS. 5-18 describe process stages of a first example process for fabricating a first example integrated assembly.

Figure 1:
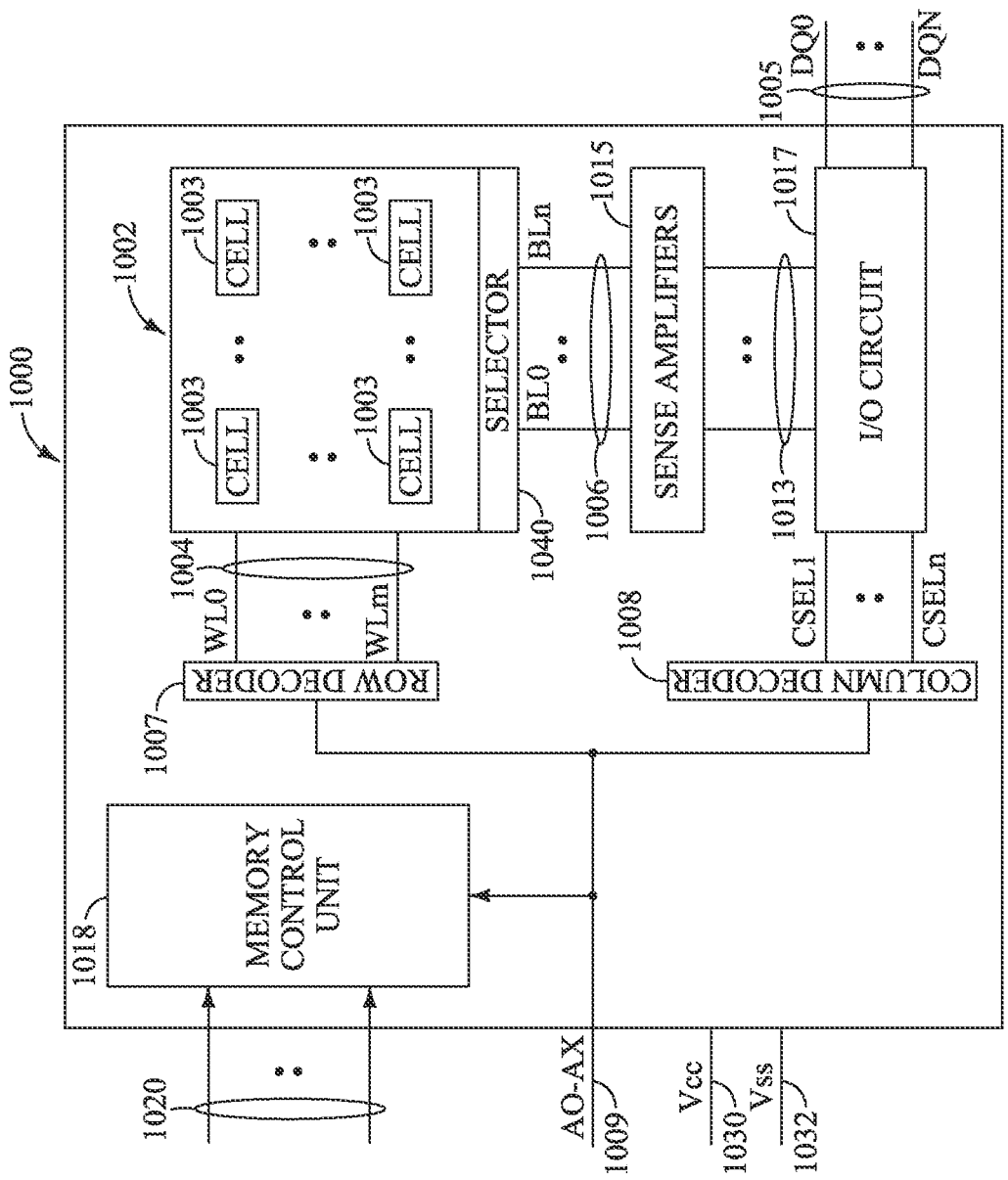
FIG. 1 shows a block diagram of a prior art memory device having a memory array with memory cells.
Figure 2:
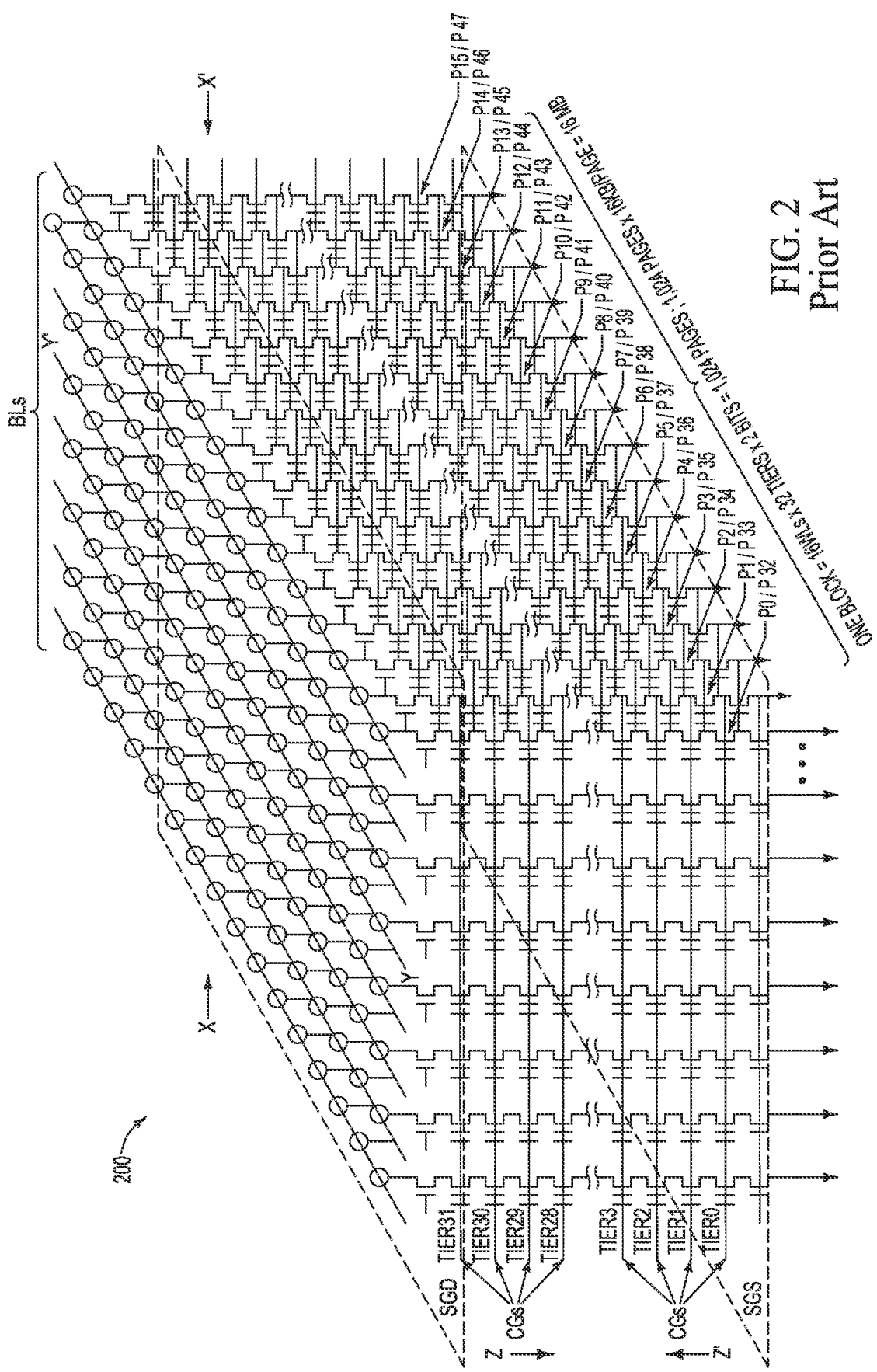
FIG. 2 shows a schematic diagram of the prior art memory array of FIG. 1 in the form of a 3D NAND memory device.
Figure 3:
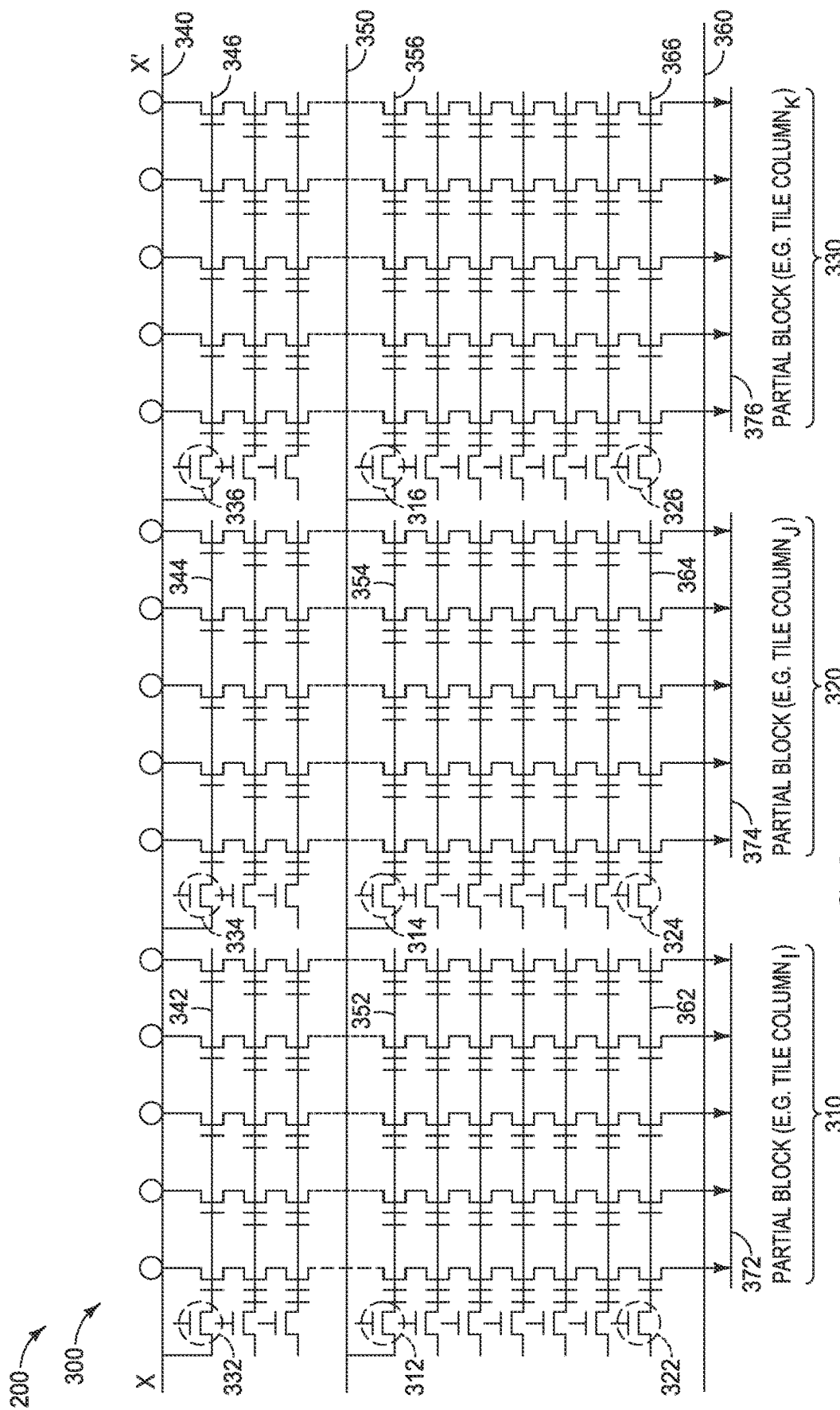
FIG. 3 shows a cross-sectional view of the prior art 3D NAND memory device of FIG. 2 in an X-X' direction.
Figure 4:
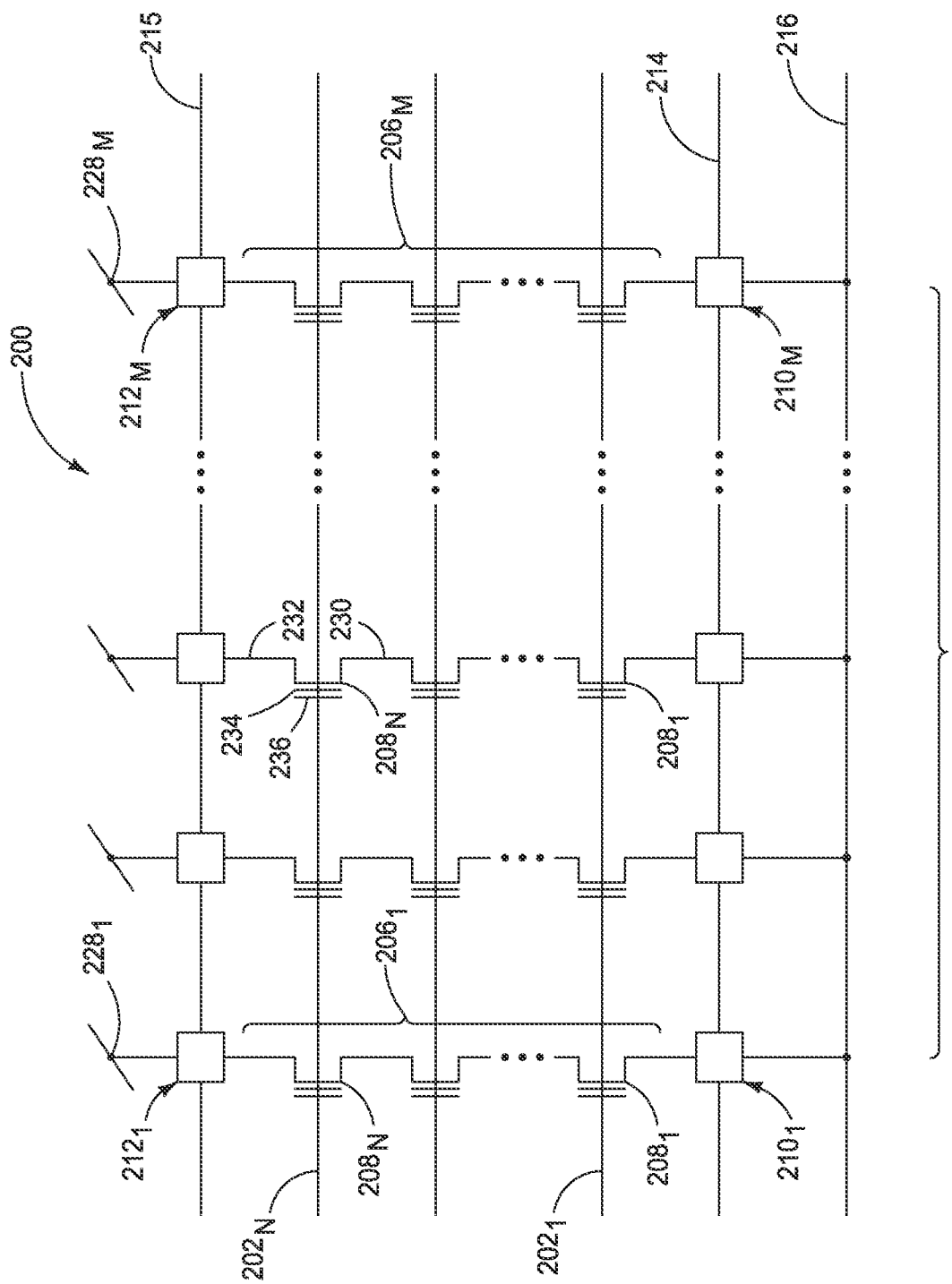
FIG. 4 is a schematic diagram of a prior art NAND memory array.
Figure 5:
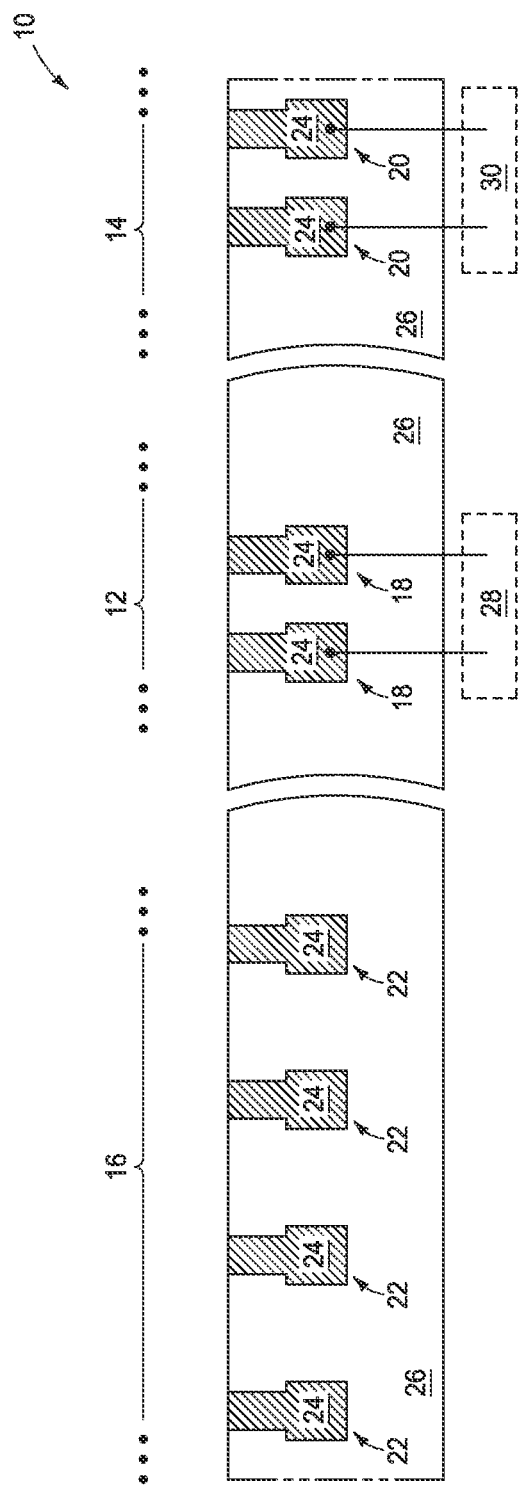
FIGS. 5-11 are diagrammatic cross-sectional side views of a region of an integrated assembly at example sequential process stages of an example method for forming an example memory array.

Referring to FIG. 5, a construction (i.e., structure, assembly, etc.) 10 includes a memory array region 12, a staircase region 16 adjacent to the memory array region, and a peripheral region 14 which is also adjacent to the memory region.

A first set of conductive nodes 18 is within the memory array region 12, a second set of conductive nodes 20 is within the peripheral region 14, and a third set of conductive nodes 22 is within the staircase region 16. The conductive nodes 18, 20 and 22 comprise a conductive material 24. The conductive material 24 may be any suitable conductive material, and in some embodiments may be a metal-containing material. For instance, the metal-containing material 24 may comprise, consist essentially of, or consist of tungsten. In some embodiments, the conductive material 24 may be considered to comprise a first composition.

The conductive nodes 18, 20 and 22 are within an insulative support material 26. The insulative support material 26 may comprise any suitable composition(s); and in some embodiments may comprise, consist essentially of, or consists of silicon dioxide.

The conductive nodes 18 are electrically coupled with circuitry 28, and the conductive nodes 20 are electrically coupled with circuitry 30. The circuitries 28 and 30 may be beneath the nodes 18 and 20 (as shown) or may be at any other suitable location relative to the nodes. In some embodiments, the nodes 18, 20 and 22 are within a first tier, and the circuitries 28 and 30 are within another tier beneath the first tier. The circuitries 28 and 30 may comprise any suitable configurations; and in some embodiments may comprise CMOS (complementary metal-oxide-semiconductor).

The conductive nodes 18 and 20 may be considered to be "live" in that they are utilized for forming electrical connection to circuitries (specifically, to the circuitries 28 and 30 in the shown embodiment). In contrast, the conductive nodes 22 are not "live", but instead are electrically floating in the shown embodiment. In other embodiments, the conductive nodes 22 may be coupled with a reference voltage; but may still not be "live" in the same sense that the conductive nodes 18 and 20 are "live" if the conductive nodes 22 are not coupled with active circuitry.

Figure 6:
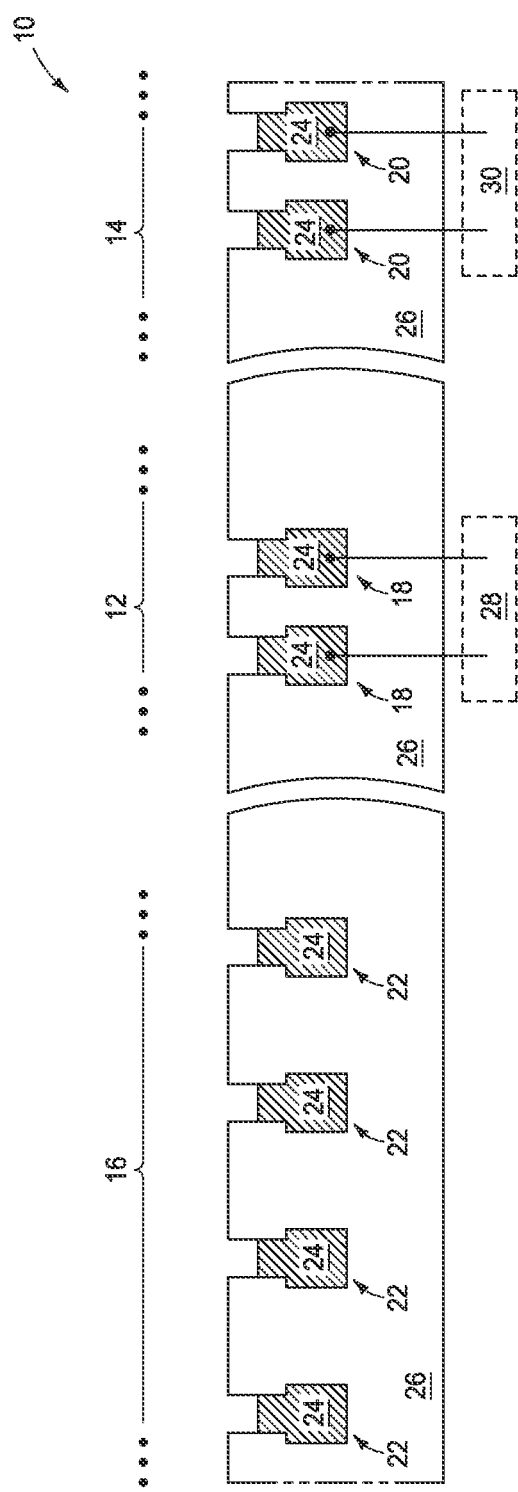

Referring to FIG. 6, upper surfaces of the conductive nodes 18, 20 and 22 are recessed relative to an upper surface of the insulative support material 26.

Figure 7:
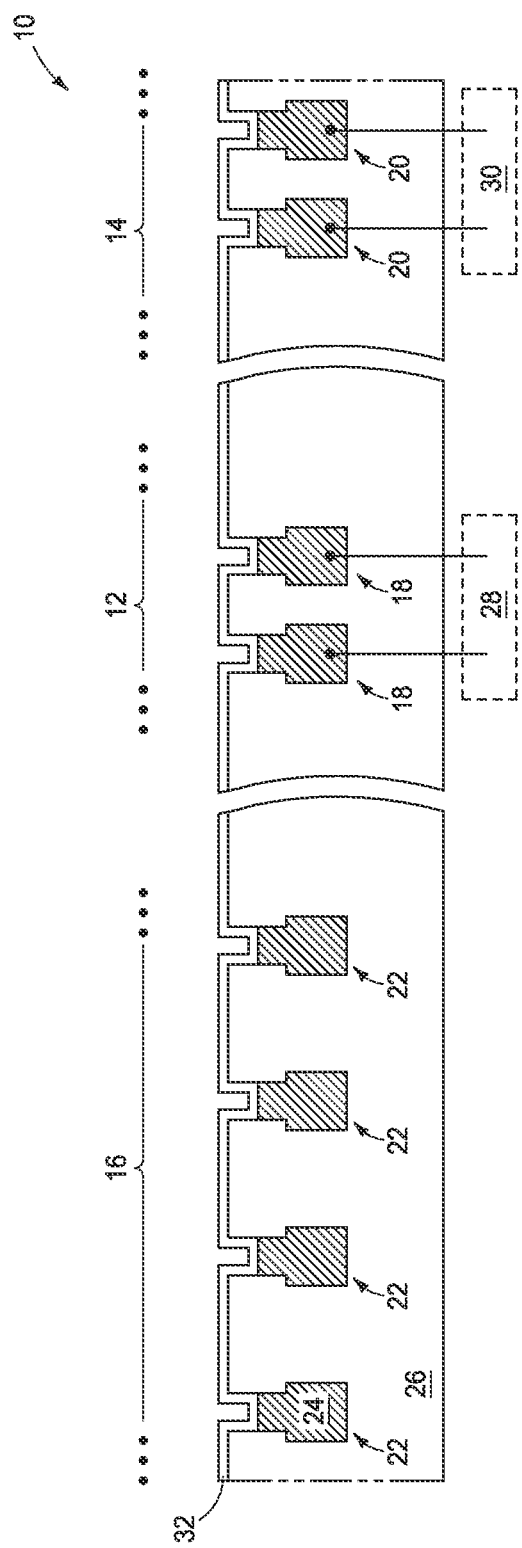

Referring to FIG. 7, a layer of material 32 is formed over the insulative support material 26 and across the recessed upper surfaces of the conductive nodes 18, 20 and 22. The material 32 may comprise any suitable composition(s); and in some embodiments may comprise one or more of metal silicide, metal carbide and metal nitride. For instance, the material 32 may comprise, consist essentially of, or consist of titanium nitride. In some embodiments, the material 32 may be referred to as a third composition to distinguish it from other materials; and in some embodiments the material 32 may be referred to as a fifth composition to distinguish it from other materials. Also, in some embodiments the material 32 is ultimately utilized to fabricate collars; and in such embodiments the material 32 may be referred to as a collar material or as a collar composition.

Figure 8:
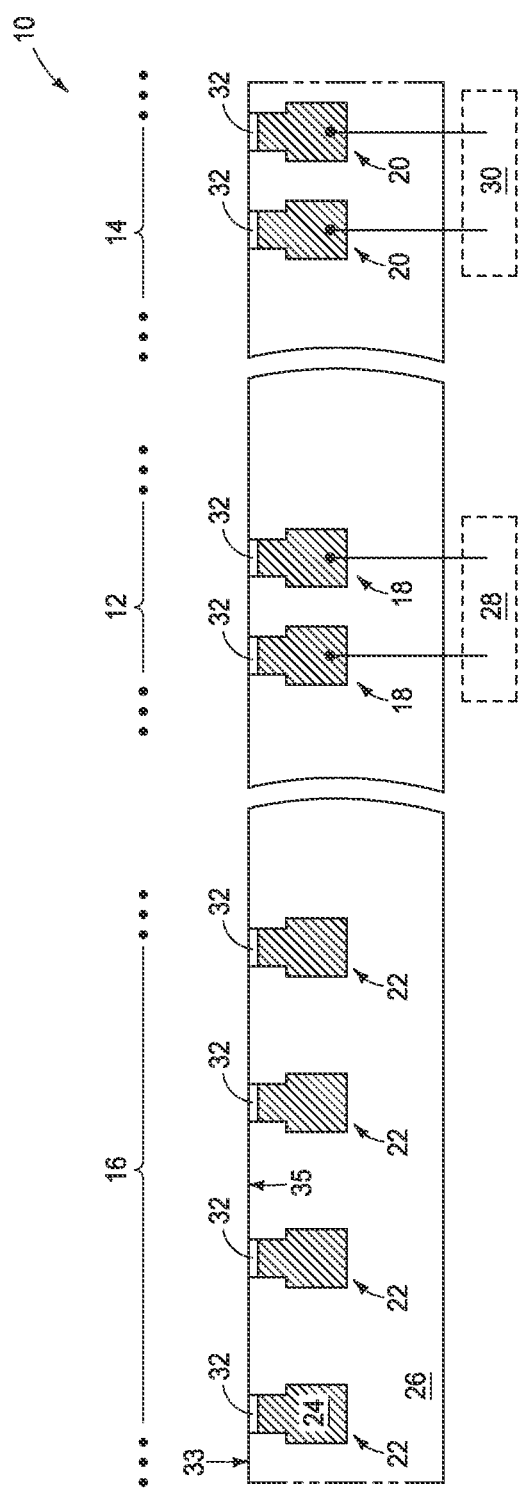

Referring to FIG. 8, the construction 10 is subjected to planarization (e.g., chemical-mechanical polishing) to remove the material 32 from over the insulative support material 26 while leaving regions of the material 32 over the recessed upper surfaces of the nodes 18, 20 and 22. The planarization forms a planarized surface 33 which extends across the insulative support material 26 and the remaining regions of the material 32.

Figure 9:
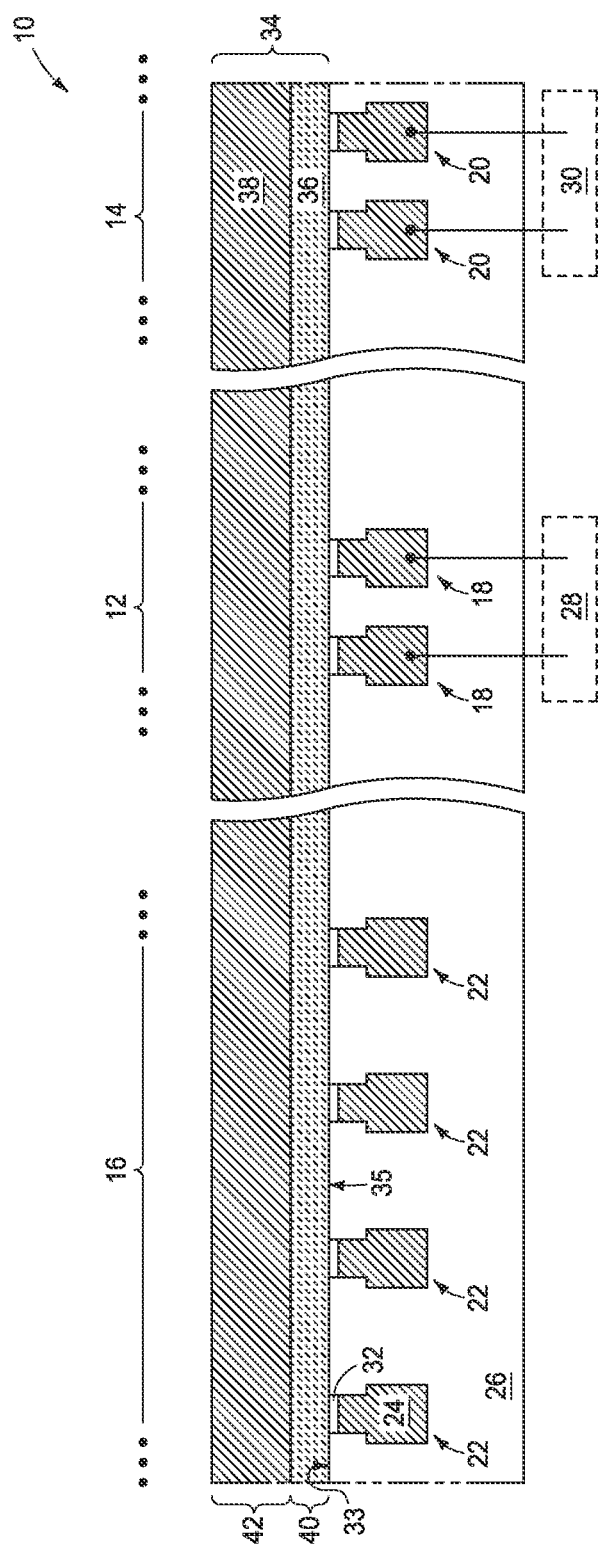

Referring to FIG. 9, a conductive expanse 34 is formed on the planarized surface 33. The conductive expanse includes two materials 36 and 38. In some embodiments, the materials 36 and 38 may be referred to as second and third materials, respectively, to distinguish them from the first material 24 of the conductive nodes 18, 20 and 22.

The material 36 may comprise any suitable electrically conductive composition(s); and in some embodiments may comprise metal silicide. For instance, the material 36 may comprise, consist essentially of, or consist of tungsten silicide ($WSi_x$, where x is greater than 0). In the shown embodiment, a bottom surface 35 of the conductive expanse 34 comprises the material 36; and accordingly may comprise, consist essentially of, or consist of tungsten silicide.

The material 38 may comprise any suitable electrically conductive composition(s); and in some embodiments may comprise, consist essentially of, or consist of conductively-doped semiconductor material. For instance, the material 38 may comprise, consist essentially of, or consist of conductively-doped silicon (e.g., n-type polycrystalline silicon).

In some embodiments, the second and third materials 36 and 38 may be considered to comprise second and third compositions, respectively. In some embodiments, the material 36 may be considered to define a first region 40 of the conductive expanse 34, and the material 38 may be considered to find a second region 42 of the conductive expanse 34; with the second region being over the first region.

Figure 10:
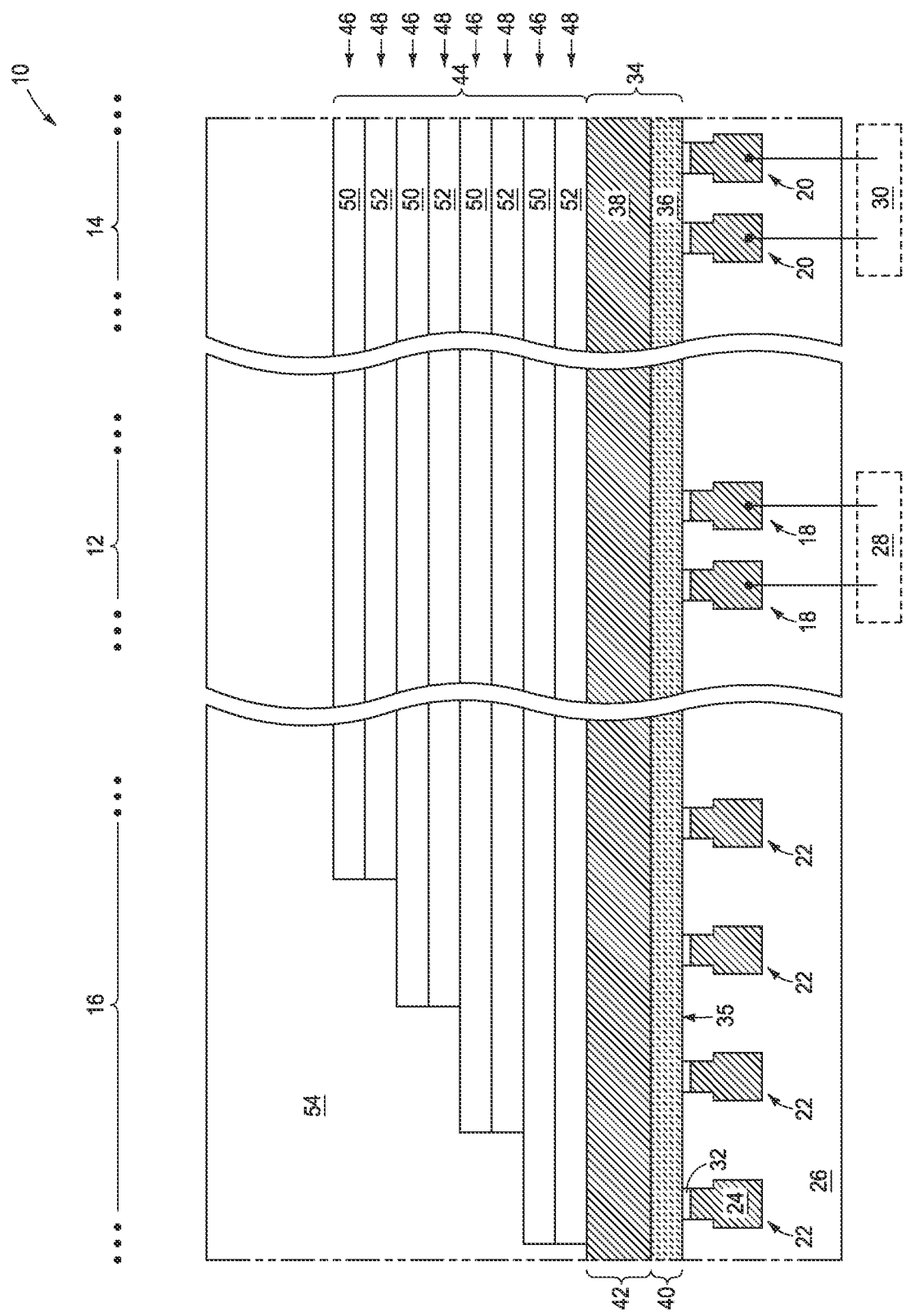

Referring to FIG. 10, a stack 44 is formed over the conductive expanse 34. The stack 44 includes first and second levels 46 and 48 which alternate with one another. The first and second levels 46 and 48 comprise first and second materials 50 and 52, respectively. In some embodiments, the first material 50 may comprise, consist essentially of, consist of silicon nitride; and the second material 52 may comprise, consist essentially of, or consist of silicon dioxide. In some embodiments, the first material 50 may correspond to a sacrificial material (i.e., a material which is eventually removed and replaced with something else), and the second material 52 may correspond to an insulative material.

Portions of the stack 44 are within the memory array region 12, the peripheral region 14 and the staircase region 16. Such portions may be considered to correspond to a memory array region of the stack, a peripheral region of the stack, and a staircase region of the stack, respectively. The conductive nodes 18 are under the memory array region 12 of the stack 44, the conductive nodes 20 are under the peripheral region 14 of the stack 44, and the conductive nodes 22 are under the staircase region 16 of the stack 44.

An additional insulative material 54 is formed over the stack 44. The insulative material 54 may comprise any suitable composition(s); and in some embodiments may comprise, consist essentially of, or consist of silicon dioxide. Accordingly, in some embodiments the material 54 may comprise a same composition as the material 52 of the stack 44.

Figure 11:
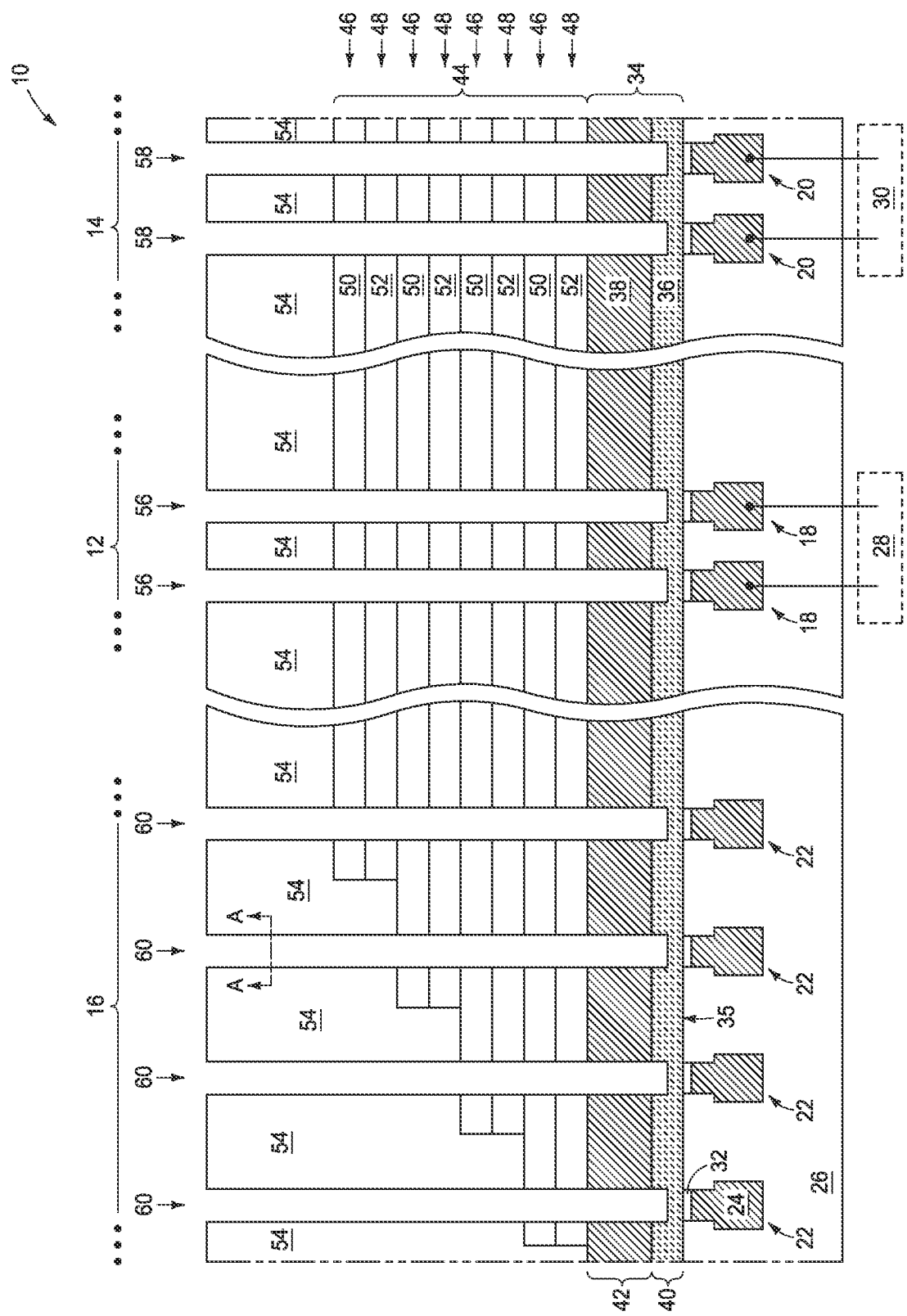

Referring to FIG. 11, openings 56, 58 and 60 are formed to extend through the stack 44 and into the conductive expanse 34. The openings 56 are a first set of openings extending through the memory array region 12 of the stack 44, the openings 58 are a second set of openings extending through the peripheral region 14 of the stack 44, and the openings 60 are a third set of openings extending through the staircase region 16 of the stack 44.

In the shown embodiment, the openings 56, 58 and 60 extend through the upper region 42 of the conductive expanse 34 and into the lower region 40 of the conductive expanse. In other words, the openings 56, 58 and 60 extend through the conductively-doped semiconductor material 38 of the conductive expanse 34 and into the metal silicide (e.g., titanium silicide) 36 of the conductive expanse.

Figure 11A:
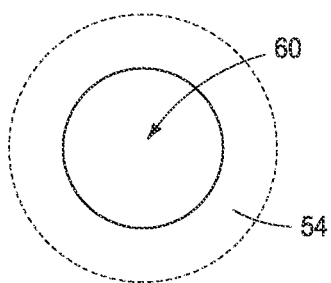
FIG. 11A is a diagrammatic cross-sectional view along the line A-A of FIG. 11.

FIG. 11A shows a view along the cross-section A-A of FIG. 11, and shows that the openings 56, 58 and 60 may be round (i.e., circular) when viewed along a horizontal cross-section. In other embodiments the openings may have other shapes along the horizontal cross-section; such as, for example, elliptical shapes, rectangular shapes, square shapes, polygonal shapes, etc.

Figure 12A:
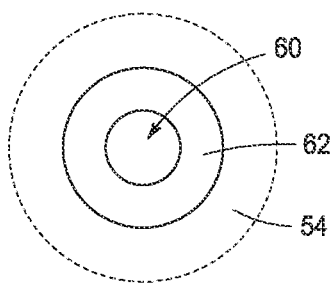
FIG. 12A is a diagrammatic cross-sectional view along the line A-A of FIG. 12.
Figure 12:
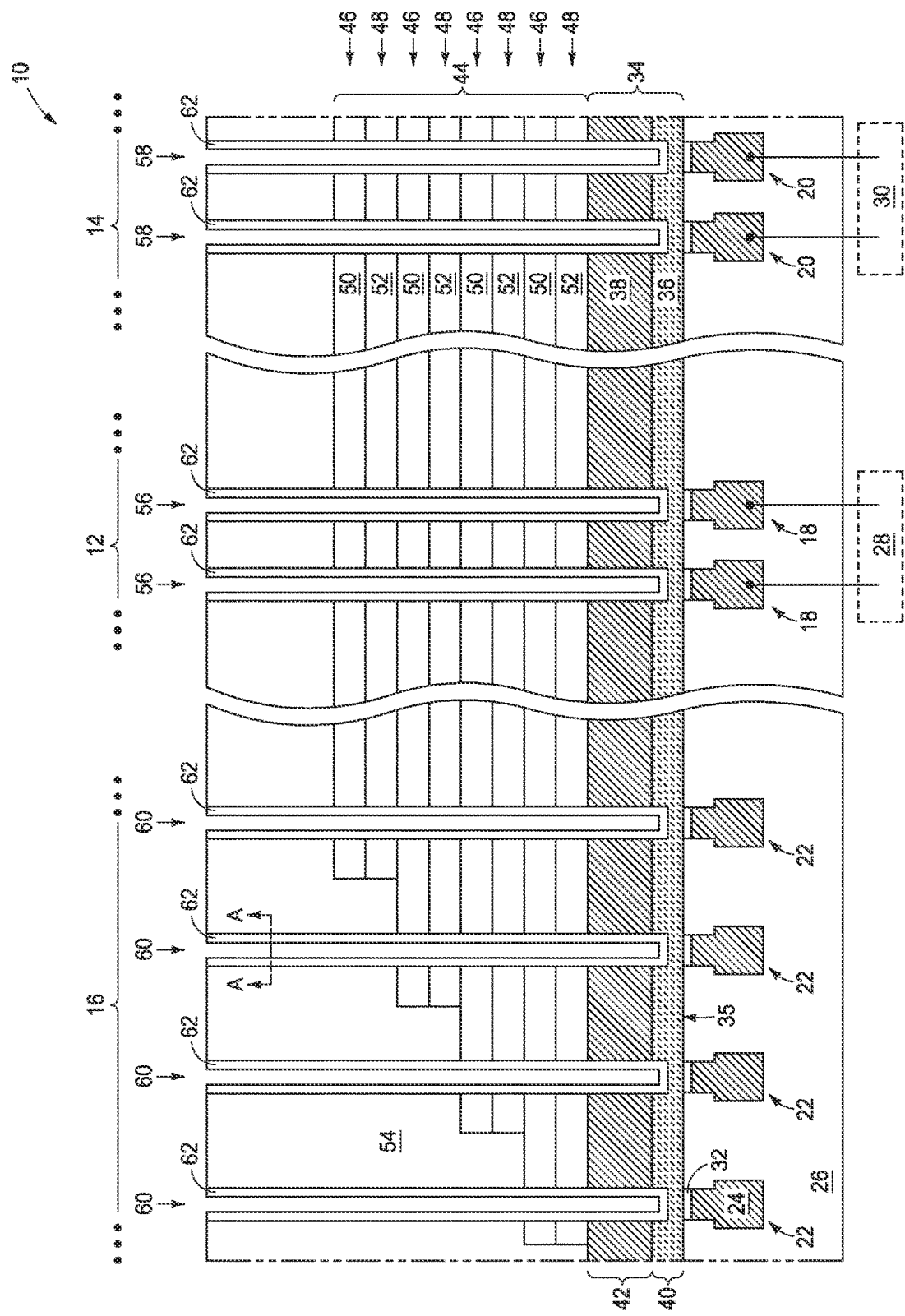
FIG. 12 is a diagrammatic cross-sectional side view of the region of the integrated assembly of FIG. 5 at an example process stage subsequent to that of FIG. 11 of an example method for forming an example memory array.

Referring to FIG. 12, the openings 56, 58 and 60 are lined with insulative material 62. The insulative material 62 may comprise any suitable composition(s); and in some embodiments may comprise, consist essentially of, or consist of silicon dioxide.

FIG. 12A shows a view along the cross-section A-A of FIG. 12, and shows the liner material 62 surrounding an inner lateral periphery of the illustrated opening 60.

Figure 13:
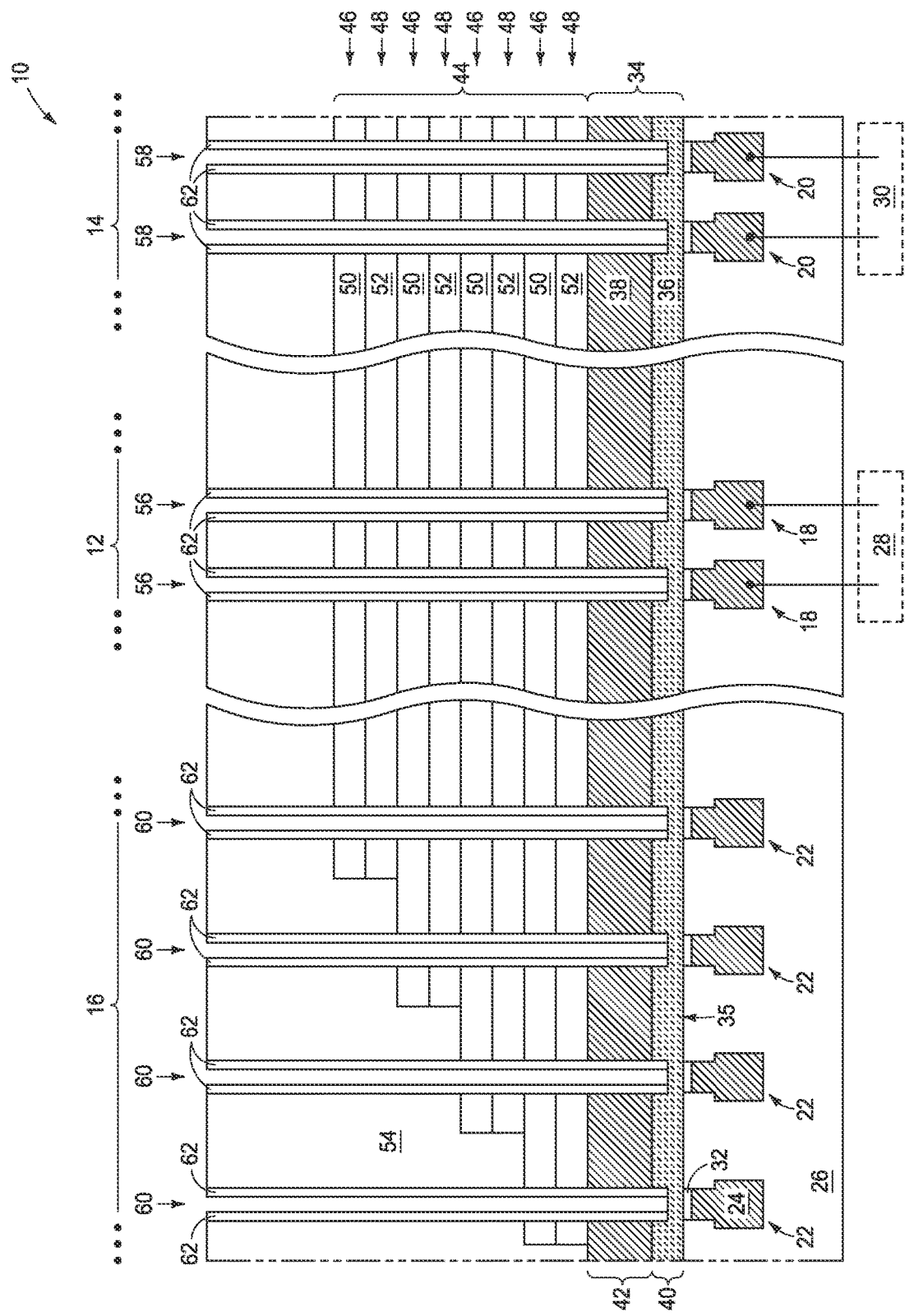
FIGS. 13-15 are diagrammatic cross-sectional side views of the region of the integrated assembly of FIG. 5 at example sequential process stages of an example method for forming an example memory array. The process stage of FIG. 13 follows that of FIG. 12.

Referring to FIG. 13, anisotropic etching is utilized to punch through the bottoms of the lined openings 56, 58 and 60, and to thereby expose the metal silicide 36 at the bottoms of the openings.

Figure 14:
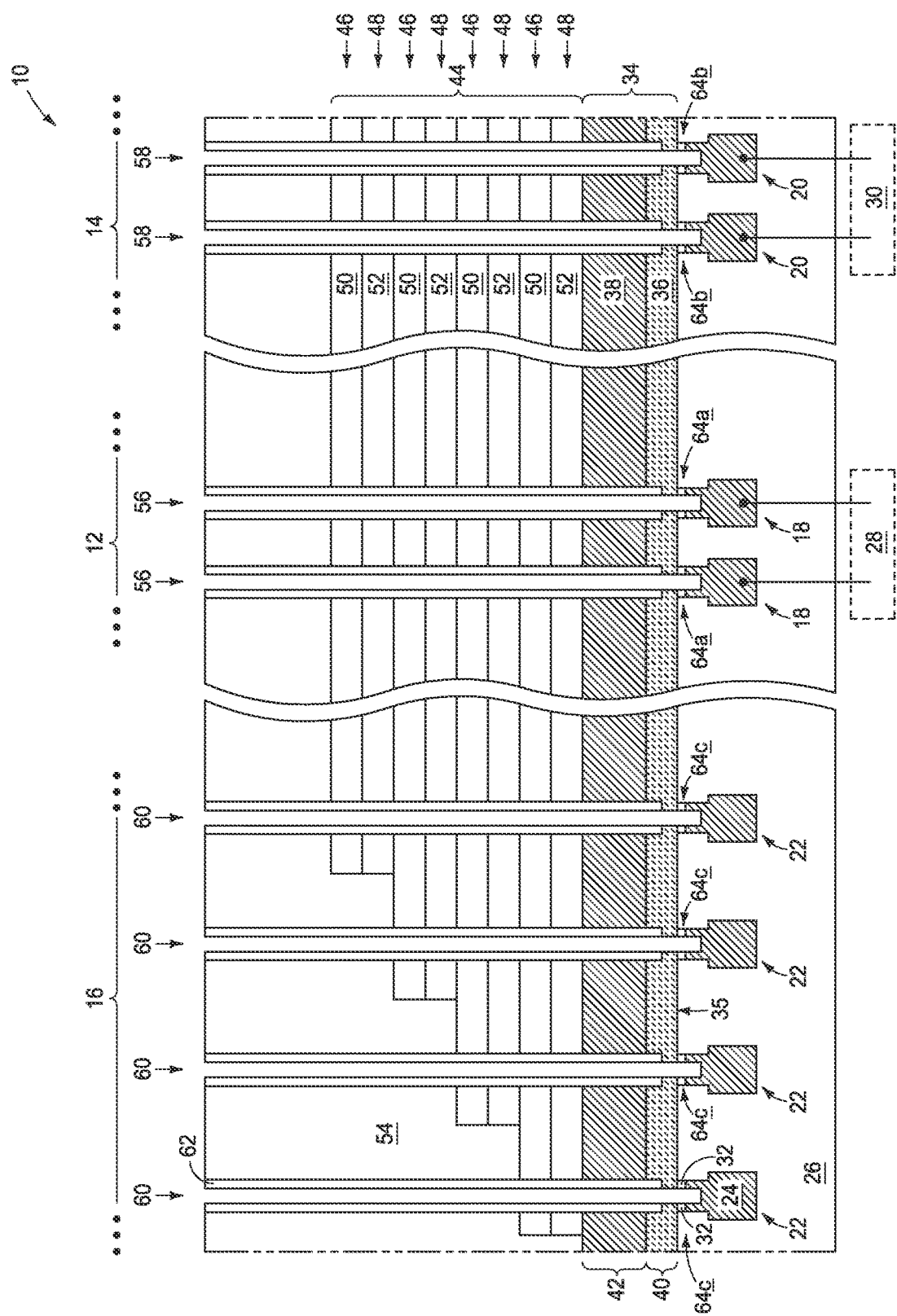

Referring to FIG. 14, the openings 56, 58 and 60 are extended into the conductive material 24 of the nodes 18, 20 and 22. In some embodiments, the processing of FIG. 14 may be considered to be a continuation of the "punch-through" step of FIG. 13, and accordingly may be considered to illustrate punching through bottoms of the lined openings 56, 58 and 60 to expose the conductive first material 24 of the conductive nodes 18, 20 and 22.

The extended openings 56, 58 and 60 pass through the material 32, and form the material 32 into collars 64. Such collars are immediately adjacent the bottom surface 35 of the expanse 34, and directly contact such bottom surface. In some embodiments, the collars 64 may be considered to comprise a first set of collars 64a along the first set of the conductive nodes (i.e., the conductive nodes 18), a second set of collars 64b along the second set of the conductive nodes (i.e., the conductive nodes 20), and a third set of collars 64c along the third set of conductive nodes (i.e., the conductive nodes 22).

Figure 15:
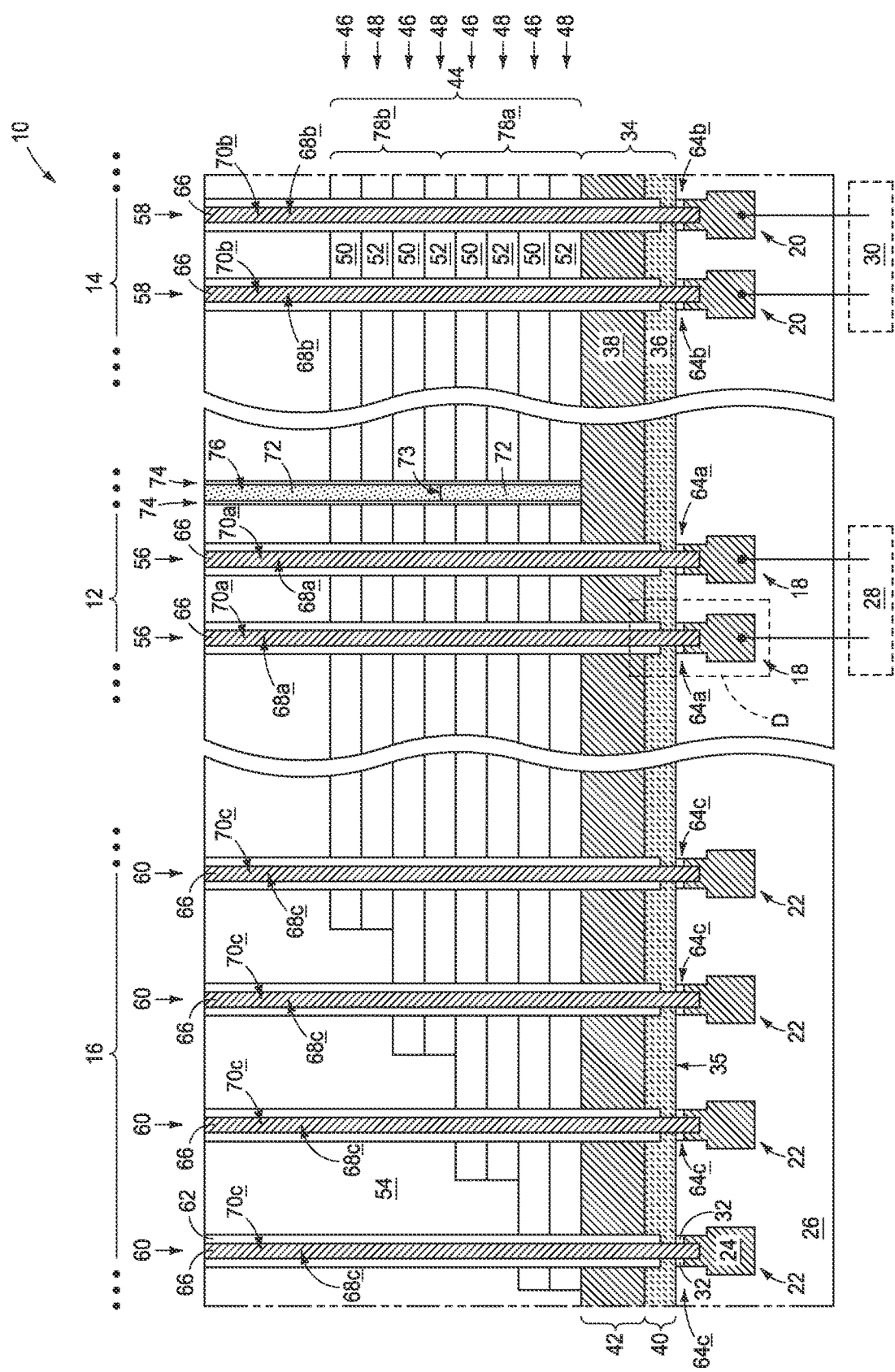

Referring to FIG. 15, a conductive material 66 is formed within the openings 56, 58 and 60. The conductive material 66 may be referred to as a fourth material to distinguish it from the first, second and third materials 24, 36 and 38. The conductive material 66 may comprise any suitable composition(s); and preferably comprises a same composition as the conductive material 24. Accordingly, the conductive materials 24 and 66 may together form electrical connections having a continuous single composition extending from the conductive nodes 18, 20 and 22 to the tops of the openings 56, 58 and 60. In some embodiments, such continuous single composition may comprise, consist essentially of, or consist of tungsten. The continuous single composition may have low resistance (high conductivity); and specifically may have lower resistance than would electrical connections having two or more different compositions.

The conductive material 66 forms conductive posts (or pillars) 68 within the openings 56, 58 and 60. In some embodiments, the posts within the memory array region 12 may be considered to correspond to a first set of posts 68a, the posts within the peripheral region 14 may be considered to correspond to a second set of posts 68b, and the posts within the staircase region 16 may be considered to correspond to a third set of posts 68c. In some embodiments, the posts 68a, 68b and 68c may be considered to extend through the memory array region 12, peripheral region 14 and staircase region 16, respectively, of the stack 44.

The posts 68a, 68b and 68c directly contact the conductive nodes 18, 20 and 22, respectively.

The posts 68, together with the insulative material 62 surrounding such posts, may be considered to be pillar structures 70. Such pillar structures may include a first set of pillar structures 70a within the memory array region 12, a second set of pillar structures 70b within the peripheral region 14, and a third set of pillar structures 70c within the staircase region 16.

A problem with conventional processing may be that the formation of posts analogous to the posts 68 of FIG. 15 may expose the polysilicon material 38 in addition to exposing the metal silicide 36 along the openings 56, 58 and 60. Accordingly, silicon from the silicon-containing material 38 may be detrimentally incorporated into the posts 68 to increase resistance of some portions of the posts. Further, the incorporation of silicon into the posts may remove silicon from adjacent regions of the conductive expanse 34, leading to voids and/or other defects within the conductive expanse. The processing described herein advantageously only exposes the metal silicide 36 along sidewalls of the openings 56, 58 and 60, and thus silicon from the material 38 of the expanse 34 is not detrimentally incorporated into the posts 68.

It is noted that the posts 68c of the staircase region 16 may be utilized for structural support only, and accordingly do not need to extend to the conductive nodes 22. In conventional processing, the posts associated with the staircase region generally do not extend to conductive nodes. However, a problem associated with conventional processing may be that the openings 60 formed within the staircase region over-penetrate the conductive expanse 34, and then the posts formed within such openings problematically create electrical connection to components beneath the conductive expanse 34. The processing of FIGS. 5-15 advantageously utilizes the additional conductive nodes 22 to capture the posts 68c associated with the staircase region 16, and may thereby avoid problems associated with such posts extending too deeply beneath the staircase region.

A channel material 72 is shown to extend through the stack 44 within the memory array region 12. The channel material 72 is laterally surrounded by a region 74. The region 74 may include charge-blocking material, charge-storage material and tunneling material (i.e., gate dielectric material). The channel material 72 and the surrounding region 74 may be together considered to be a channel-material-structure 76.

The channel material 72 may include any suitable semiconductor composition(s); and in some embodiments may include silicon. The channel material 72 directly contacts the conductive expanse 34. In the shown embodiment, the channel material 72 is shown to comprise two portions which join at an interface 73. Such is utilized to indicate that the stack 44 may include two decks 78a and 78b which are stacked one atop another. The decks may be processed separately relative to one another so that wordline levels (described below) are formed within the first deck 78a, and then the second deck 78b of the stack 44 is formed and processed to form wordline levels within the second deck. The processing described herein is simplified by showing the entire stack 44 being simultaneously processed; but is to be understood that in some embodiments the stack may be subdivided amongst two or more decks which are sequentially processed.

Figure 16:
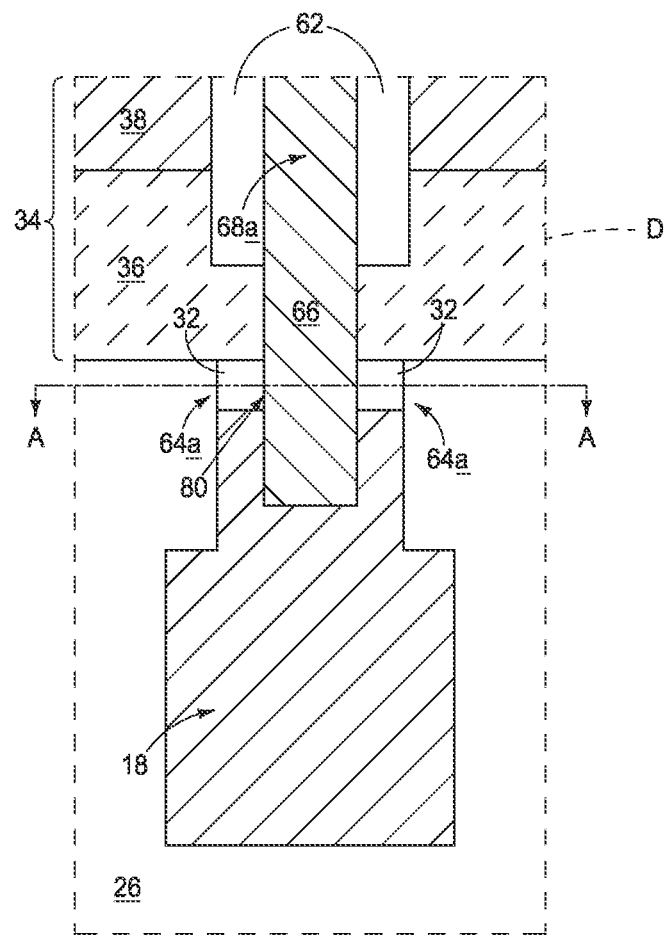
FIG. 16 is an enlarged view of a region "D" of the integrated assembly of FIG. 15.
Figure 16A:
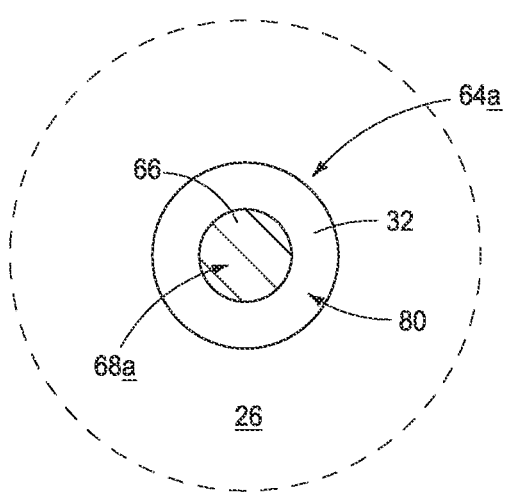
FIG. 16A is a diagrammatic cross-sectional view along the line A-A of FIG. 16.

FIG. 16 shows an enlarged region "D" from the construction 10 of FIG. 15. The region "D" of FIG. 16 includes a collar 64a of the material 32. FIG. 16A shows a cross-section along the line A-A of FIG. 16, and shows the collar 64a surrounding a region 80 of the post 68a. The other collars of FIG. 15 analogously surround regions of the associated posts 68.

Figure 17:
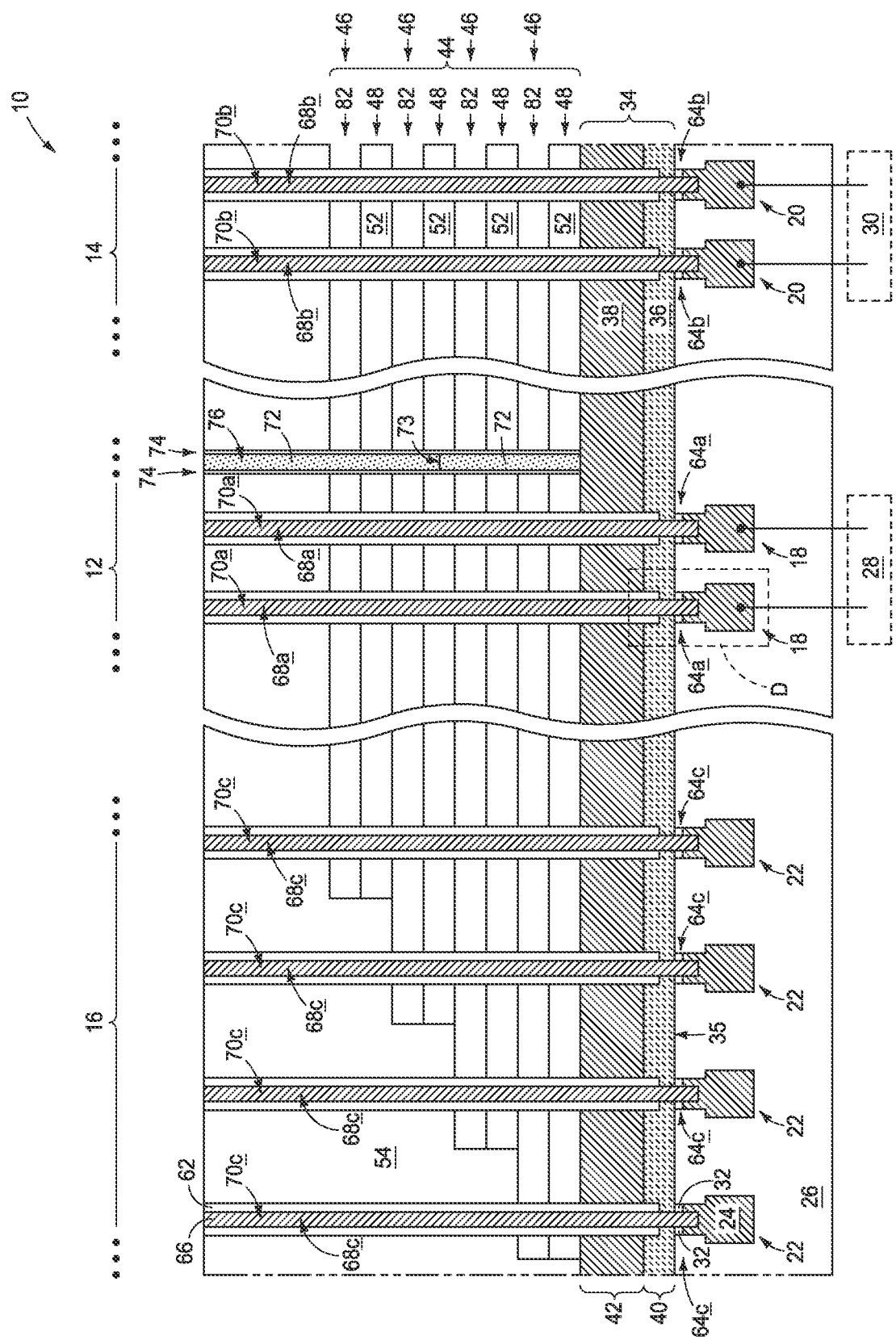
FIGS. 17 and 18 are diagrammatic cross-sectional side views of the region of the integrated assembly of FIG. 5 at example sequential process stages of an example method for forming an example memory array. The process stage of FIG. 17 follows that of FIG. 15.

Referring to FIG. 17, the first material 50 (FIG. 15) is removed to leave voids 82 along the first levels 46. The pillar structures 70, together with the channel-material-structures 76, may support the insulative material 52 of the levels 48 after the voids are formed along the levels 46. The structures 70c are the only support structures within the staircase region 16. In some embodiments, a primary role of the structures 70c within the staircase region 16 is to provide support to the levels 48 at the processing stage of FIG. 17. In such embodiments, the structures 70c may have no electrical function in a final assembly.

Figure 18:
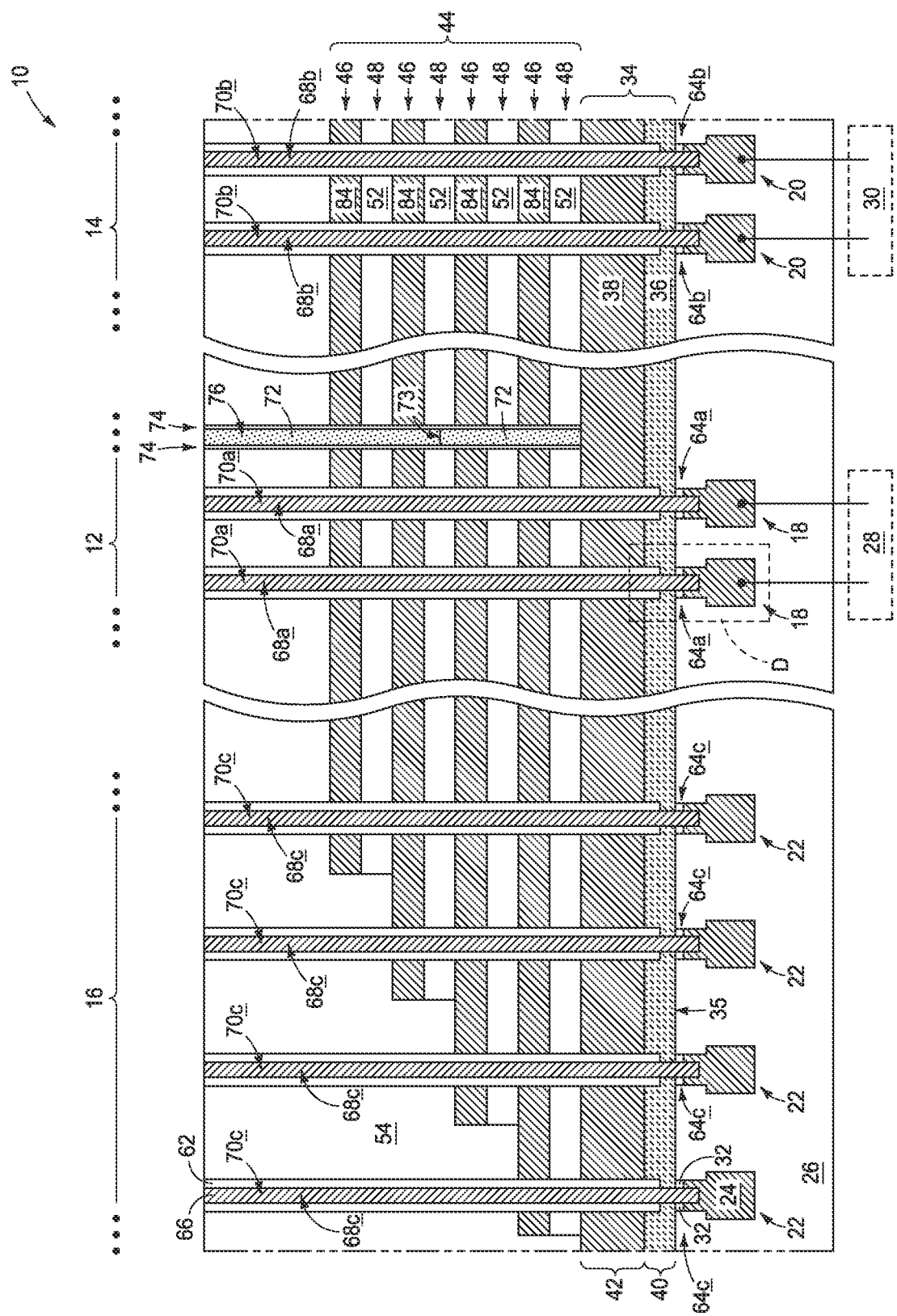

Referring to FIG. 18, conductive wordline material 84 is formed within the voids 82 (FIG. 17). The levels 46 thus become conductive wordline levels, and the stack 44 becomes a stack of alternating insulative levels 48 and conductive wordline levels 46. In some embodiments, the wordline levels 46 may be NAND wordline levels. Accordingly, the construction 10 of FIG. 18 may be an integrated assembly comprising a NAND memory array within the memory array region 12. Such memory array may be analogous to the NAND memory arrays described above with reference to FIGS. 1-4. Any suitable number of wordline levels 46 may be utilized in the NAND memory array; including, for example, eight levels, 16 levels, 32 levels, 64 levels, 128 levels, 256 levels, 512 levels, 1024 levels, etc. NAND strings may be along the channel-material-structures 76, with such NAND strings being coupled with a source structure corresponding to the conductive expanse 34.

In some embodiments, the collars 64 may be omitted. An example of such embodiments is described with reference to FIGS. 19-24.

Figure 19:
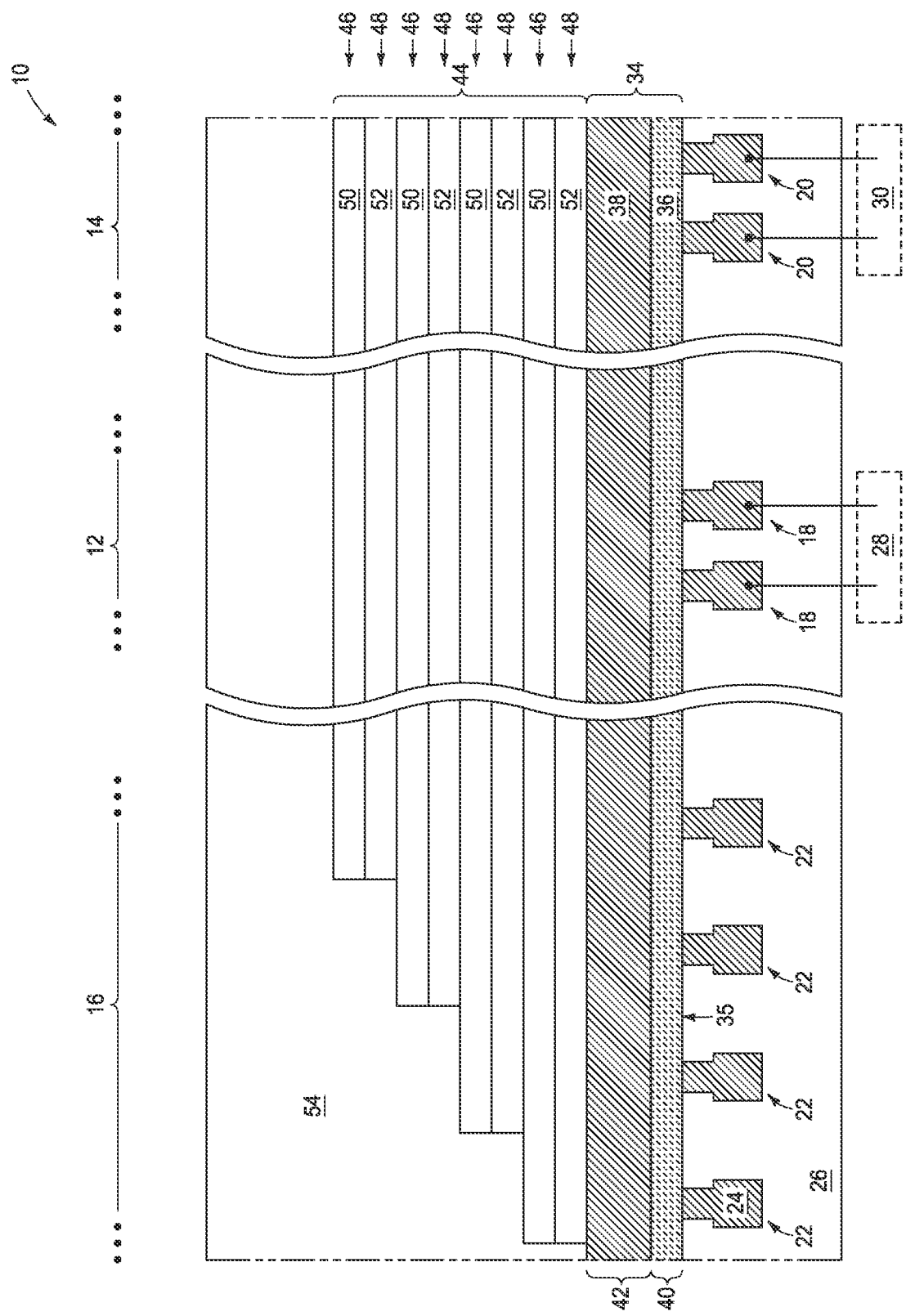
FIGS. 19-24 are diagrammatic cross-sectional side views of a region of an integrated assembly at example sequential process stages of an example method for forming an example memory array. The process stage of FIG. 19 may follow that of FIG. 5.

Referring to FIG. 19, the construction 10 is shown at a processing stage subsequent to that of FIG. 5, and analogous to that of FIG. 10, in an embodiment in which the collar material 32 is omitted.

Figure 20:
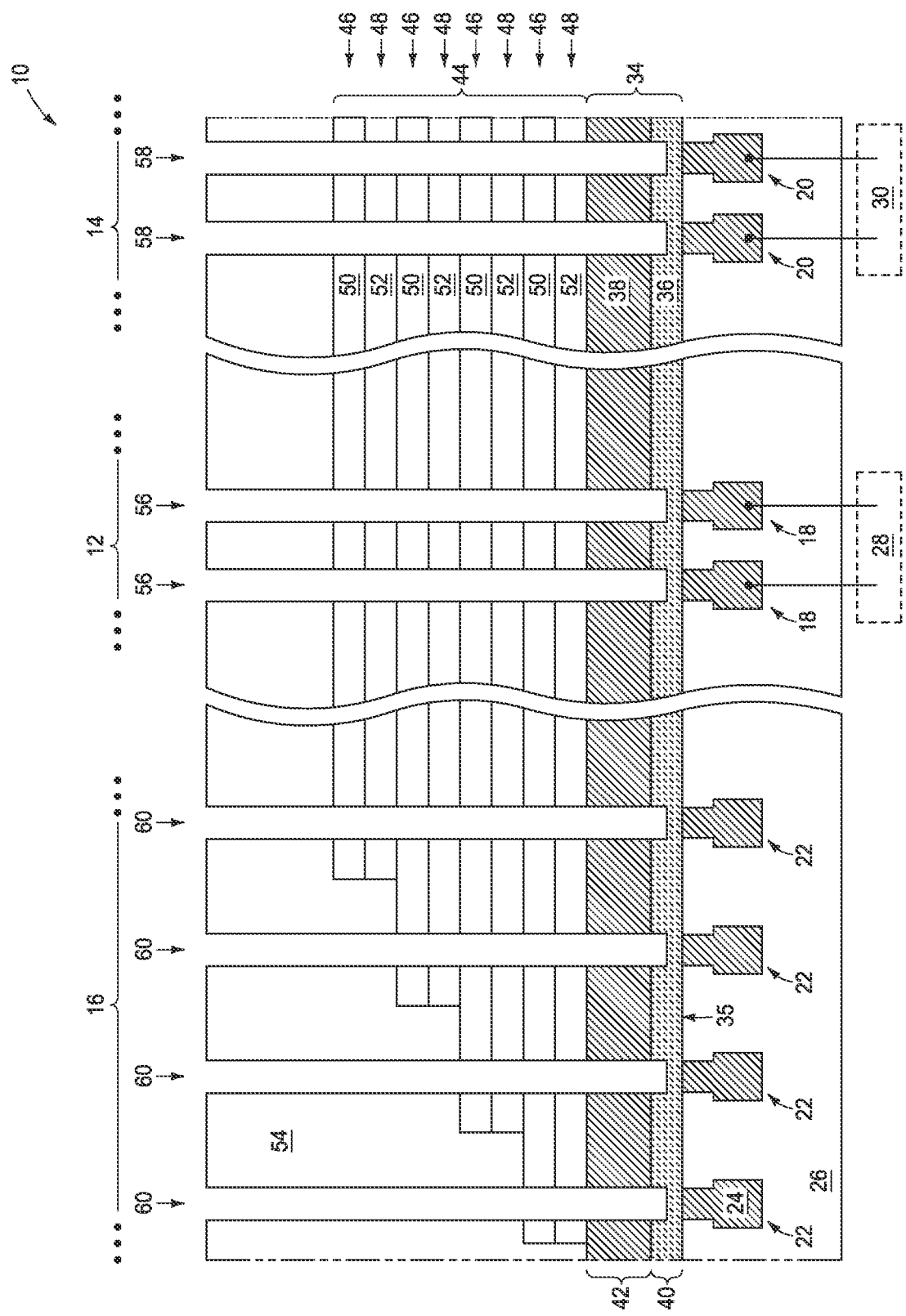

Referring to FIG. 20, the openings 56, 58 and 60 are formed with processing analogous to that described above with reference to FIG. 11. The openings extend into the metal silicide 36 of the conductive expanse 34.

Figure 21:
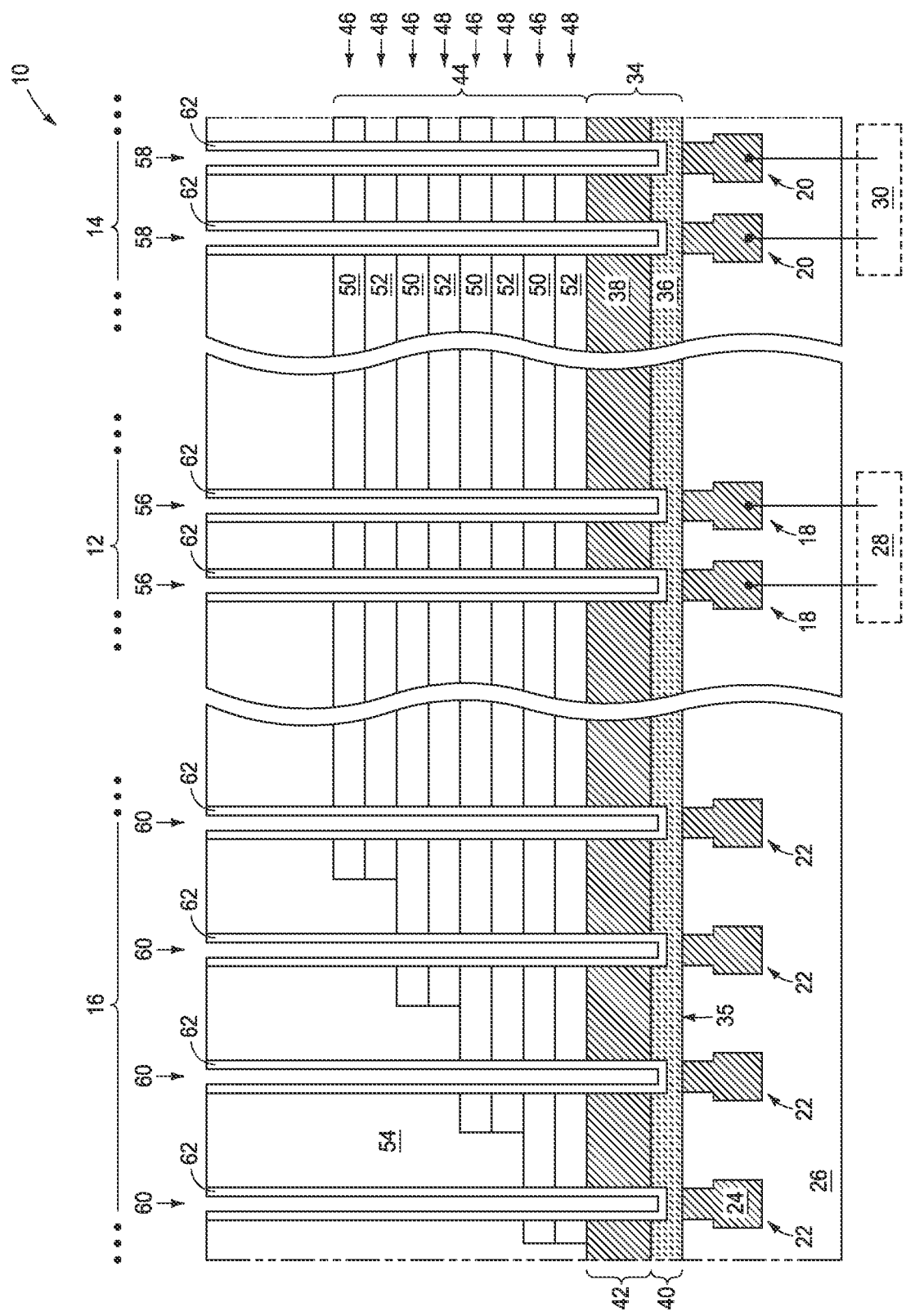

Referring to FIG. 21, the openings 56, 58 and 60 are lined with the liner material 62 with processing analogous that described above with reference to FIG. 12.

Figure 22:
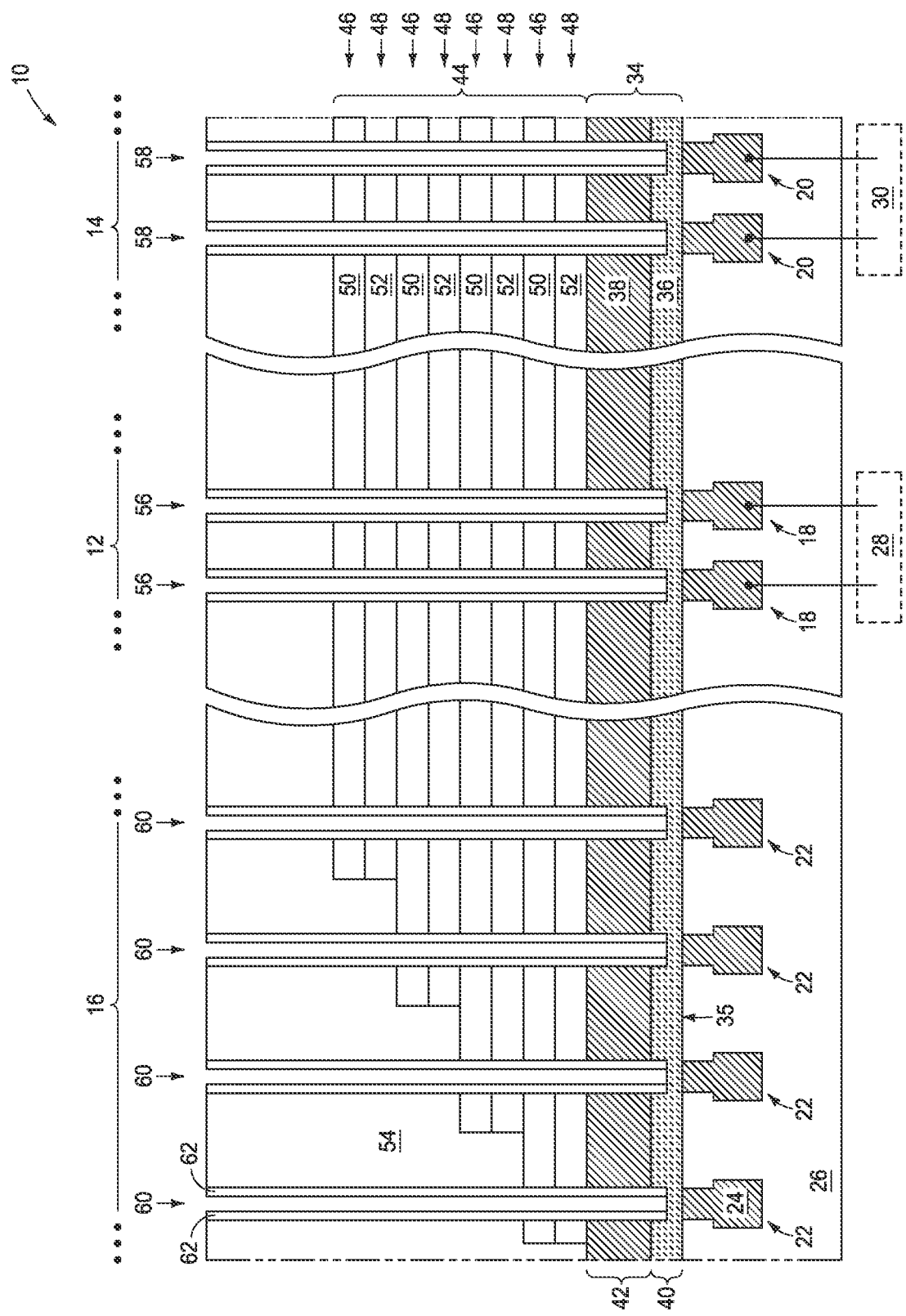

Referring to FIG. 22, bottom regions of the liner material 62 are removed with processing analogous to that described above with reference to FIG. 13.

Figure 23:
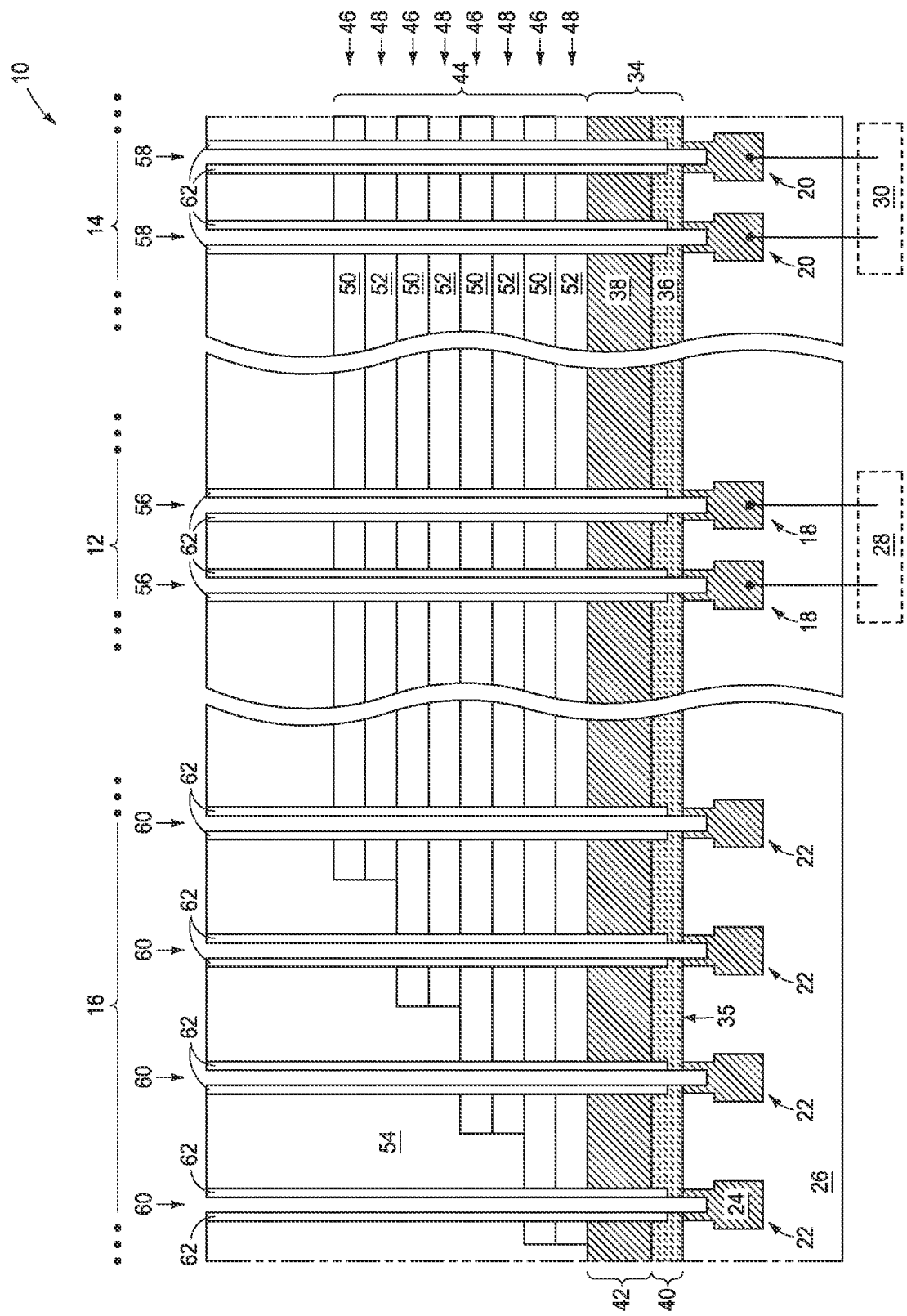

Referring to FIG. 23, the openings 56, 58 and 60 are extended into the conductive material 24 of the nodes 18, 20 and 22. Since the bottoms of the openings were within the metal silicide 36, and since the sidewalls of the openings are protected by the liner 62, the semiconductor material 38 (e.g., silicon) of the conductive expanse 34 is not exposed along the openings. In some embodiments the steps of FIGS. 22 and 23 may be considered to be punching through the bottoms of the lined openings 56, 58 and 60, through the second material 40, and into the first material 24.

Figure 24:
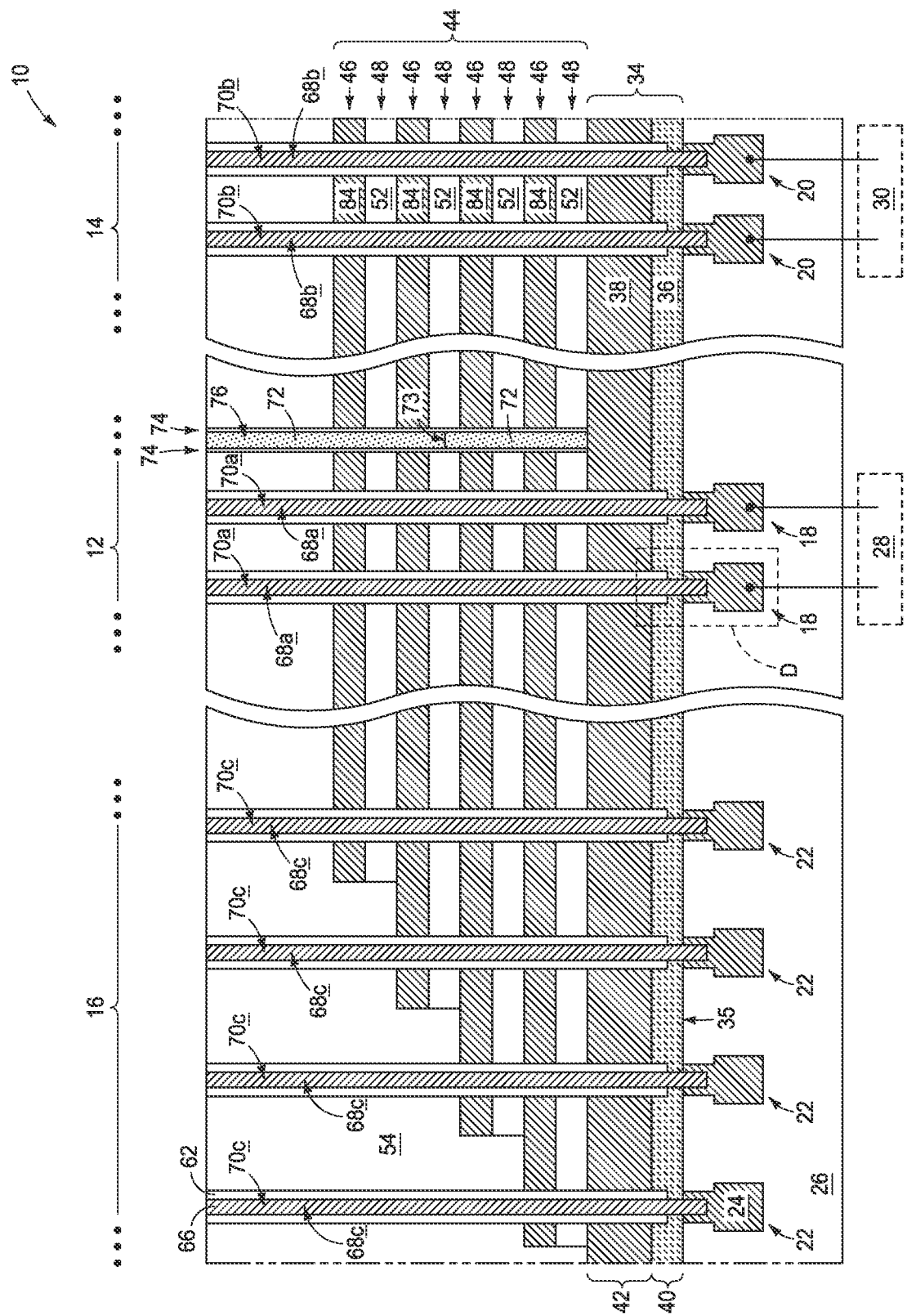

Referring to FIG. 24, the conductive material 66 is formed within the openings 56, 58 and 60 (FIG. 23) to form the conductive pillars 68 of the pillar structures 70. Since the semiconductor material 38 is not exposed along the openings 56, 58 and 60 (as described above with reference to FIG. 23), the conductive material 66 of the pillars 68 is not modified by the semiconductor material. Accordingly, the conductive pillars 68 directly contact the conductive material 24 of the conductor nodes 18, 20 and 22; and in some embodiments may be a same material as the conductive material 24 so that a single continuous material extends from the conductive nodes 18, 20 and 22 to the upper surfaces of the pillars 68. Such single continuous material may have low resistance (high conductivity) as compared to materials comprising two or more different compositions, which may be advantageous for the "live" connections associated with the memory array region 12 and the peripheral region 14.

FIG. 24 also shows the conductive wordline material 84 formed along the levels 46, and the channel-material-structure 76 formed within the memory array region 12. Accordingly, the construction 10 of FIG. 24 may comprise a NAND assembly analogous to that described above with reference to FIG. 18.

As discussed above, there may be two different problems addressed utilizing the above-described methodology of forming the pillar structures 70. One of the problems is associated with the staircase region in that the posts of conventional architectures may problematically penetrate through the conductive expanse 34 during formation of the posts. The other of the problems is associated with the memory array region 12 and the peripheral region 14 in that posts of conventional architectures may have higher-than-desired resistance. The first problem may be addressed by providing the conductive nodes 22 under the conductive expanse 34 to "catch" the posts 68a and prevent them from over-penetrating into underlying conductive materials. The second problem may be addressed by forming the conductive material 66 of the posts 68a and 68b to comprise a same material as the conductive nodes 18 and 20, with such material of the posts 68a and 68b being directly against the material of the conductive nodes.

In some embodiments, the structures utilized to "catch" the posts 68c of the staircase region 12 may be provided within the conductive expanse 34, rather than being provided beneath the conductive expanse. An example of such embodiments is described with reference to FIGS. 25-32.

Figure 25:
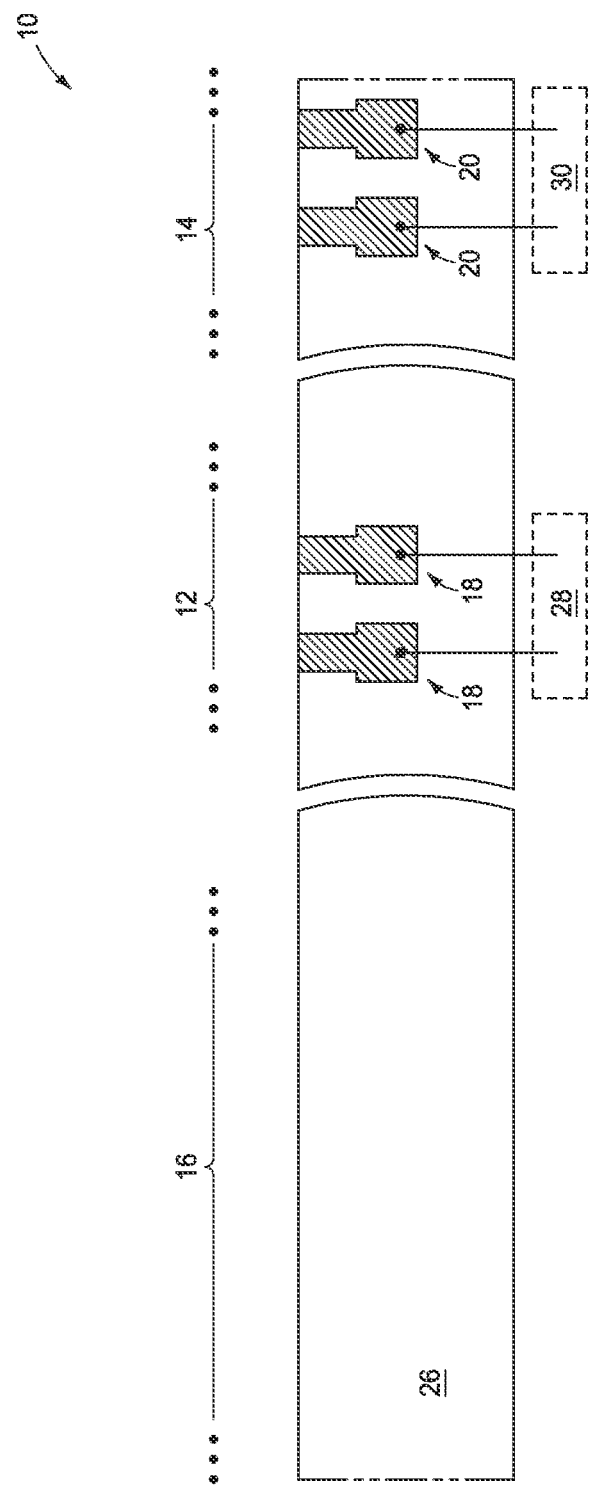
FIGS. 25-32 are diagrammatic cross-sectional side views of a region of an integrated assembly at example sequential process stages of an example method for forming an example memory array.

Referring to FIG. 25, the construction 10 is shown at a process stage analogous to that described above with reference to FIG. 5. However, unlike the process stage of FIG. 5, there are no conductive nodes provided within the staircase region 16.

Figure 26:
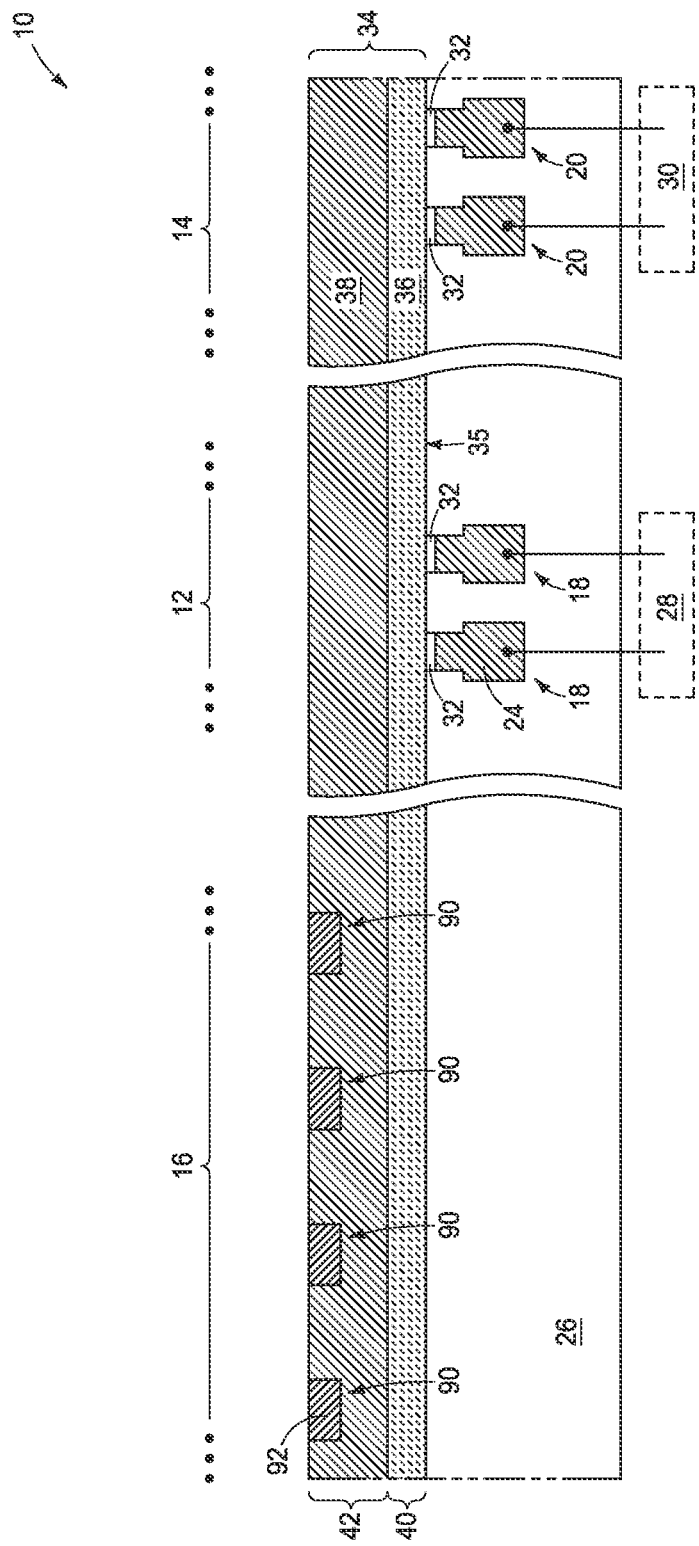

Referring to FIG. 26, the construction 10 is shown at a process stage analogous to that described above with reference to FIG. 9. The collar material 32 is formed over the nodes 18 and 20 within the regions 12 and 14. The expanse 34 is then formed over the nodes 18 and 20. The expanse 34 comprises the metal-silicide material 36, and the semiconductor material 38 over the metal-silicide material. The embodiment of FIG. 26 further includes stopping structures 90 within the semiconductor material 38. In some embodiments, the structures 90 may be conductive structures, and may be referred to as conductive nodes (although the structures 90 would generally not be utilized for forming "live" connections). The nodes 90 may be referred to as a third set of nodes to distinguish them from the first and second sets nodes 18 and 20.

The stopping structures 90 comprise stopping material 92. Such material may comprise any suitable composition(s); and in some embodiments may comprise, consist essentially of, or consist of metal (e.g., tungsten). Accordingly, in some embodiments the material 92 of the stopping structures 90 may comprise a same composition as the material 24 of the nodes 18 and 20.

Figure 27:
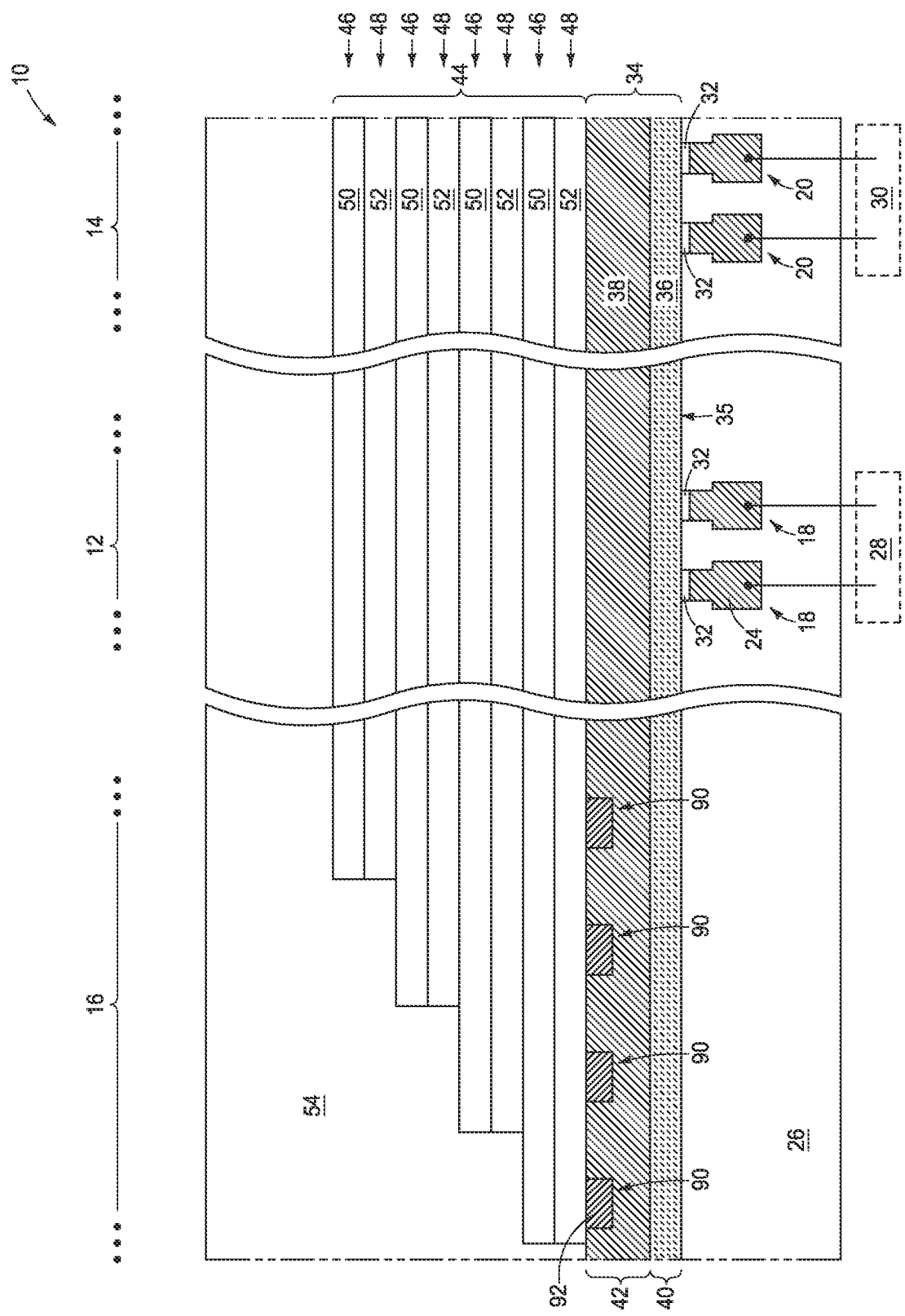

Referring to FIG. 27, the stack 44 is formed over the expanse 34 with processing analogous to that described above with reference to FIG. 10.

Figure 28:
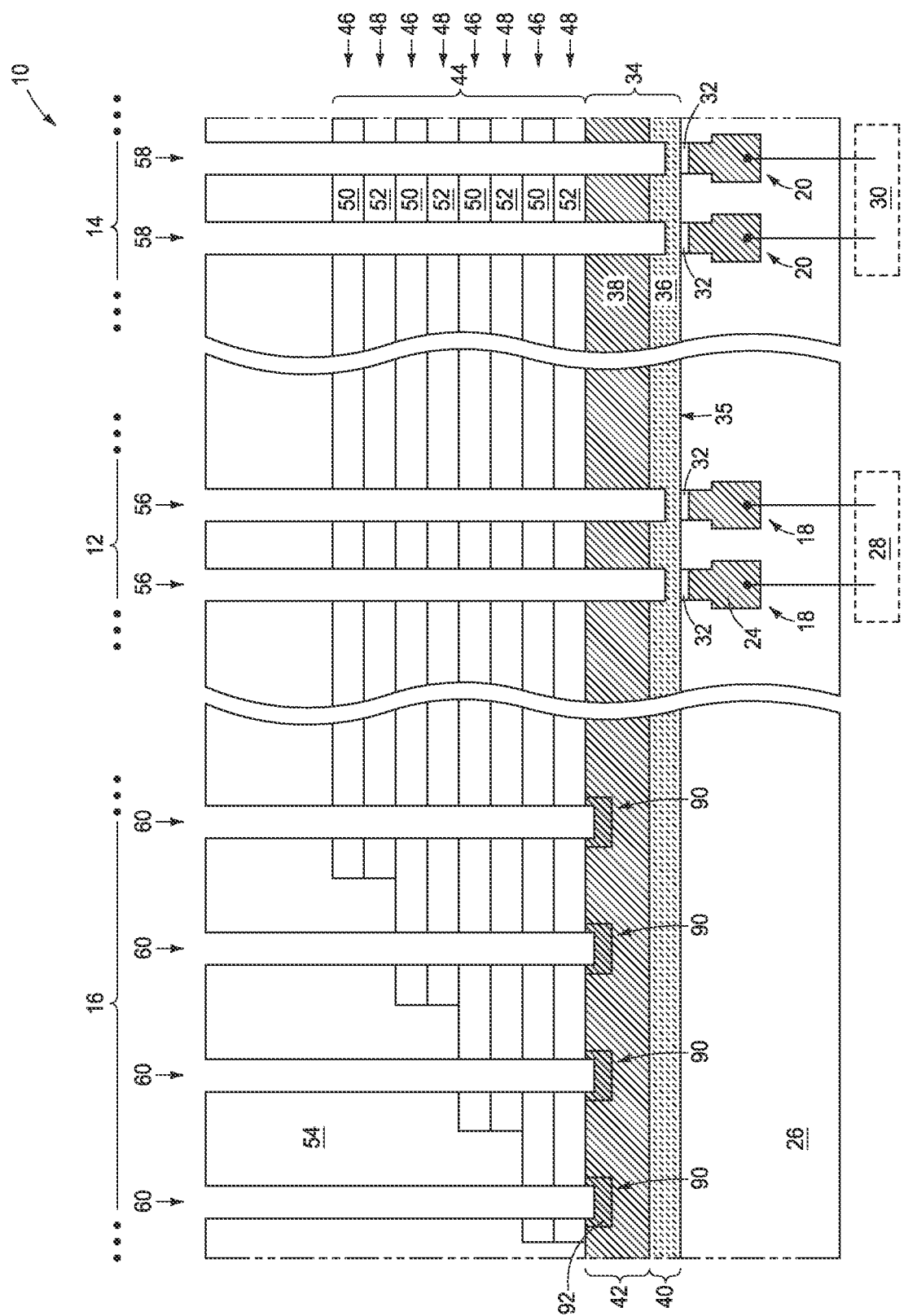

Referring to FIG. 28, the openings 56, 58 and 60 are formed with processing analogous to that described above with reference to FIG. 11. The openings 56 and 58 extend into the metal silicide 36 of the conductive expanse 34. The openings 60 extend into the stopping structures 90.

Figure 29:
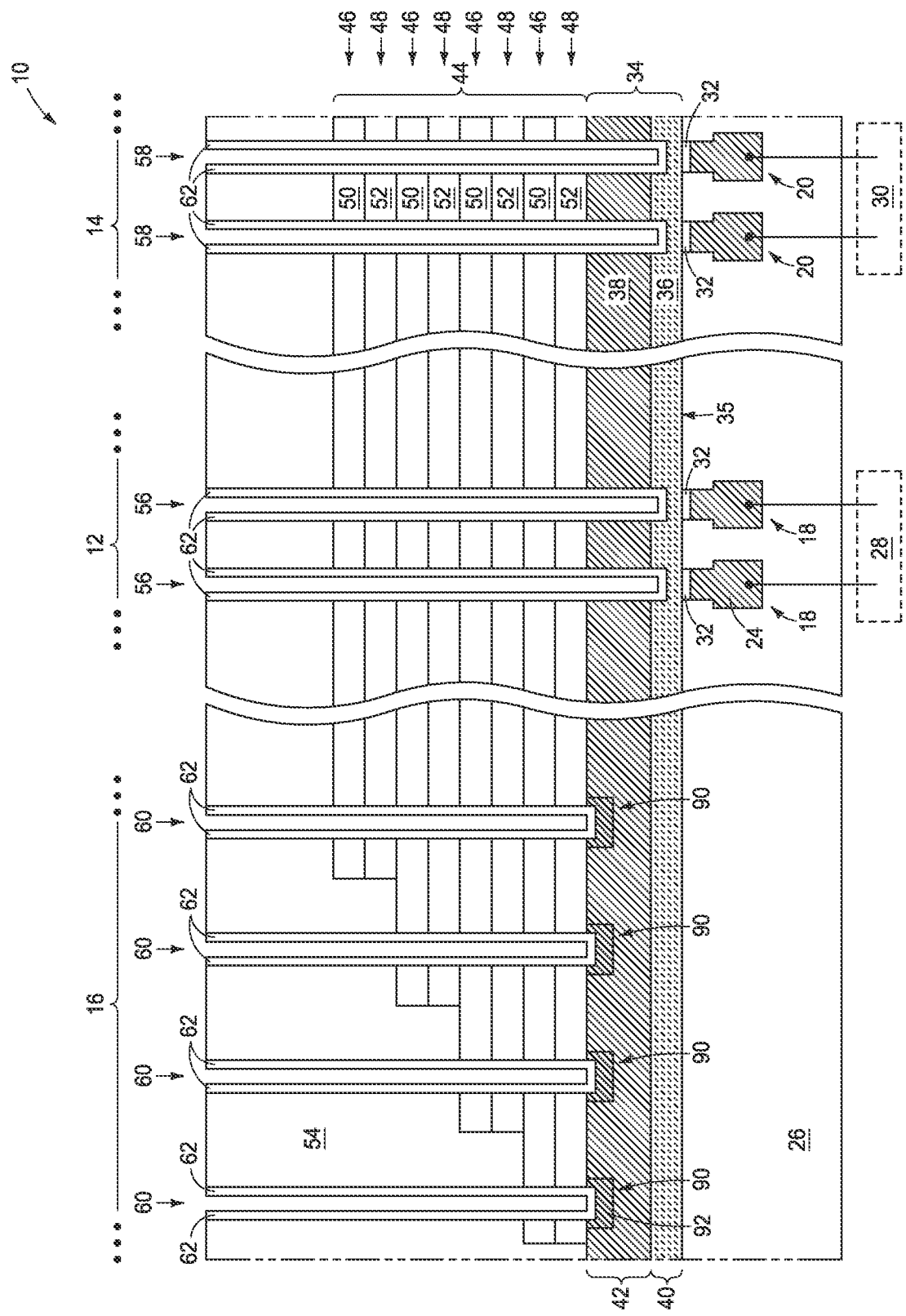

Referring to FIG. 29, the openings 56, 58 and 60 are lined with the liner material 62 with processing analogous that described above with reference to FIG. 12.

Figure 30:
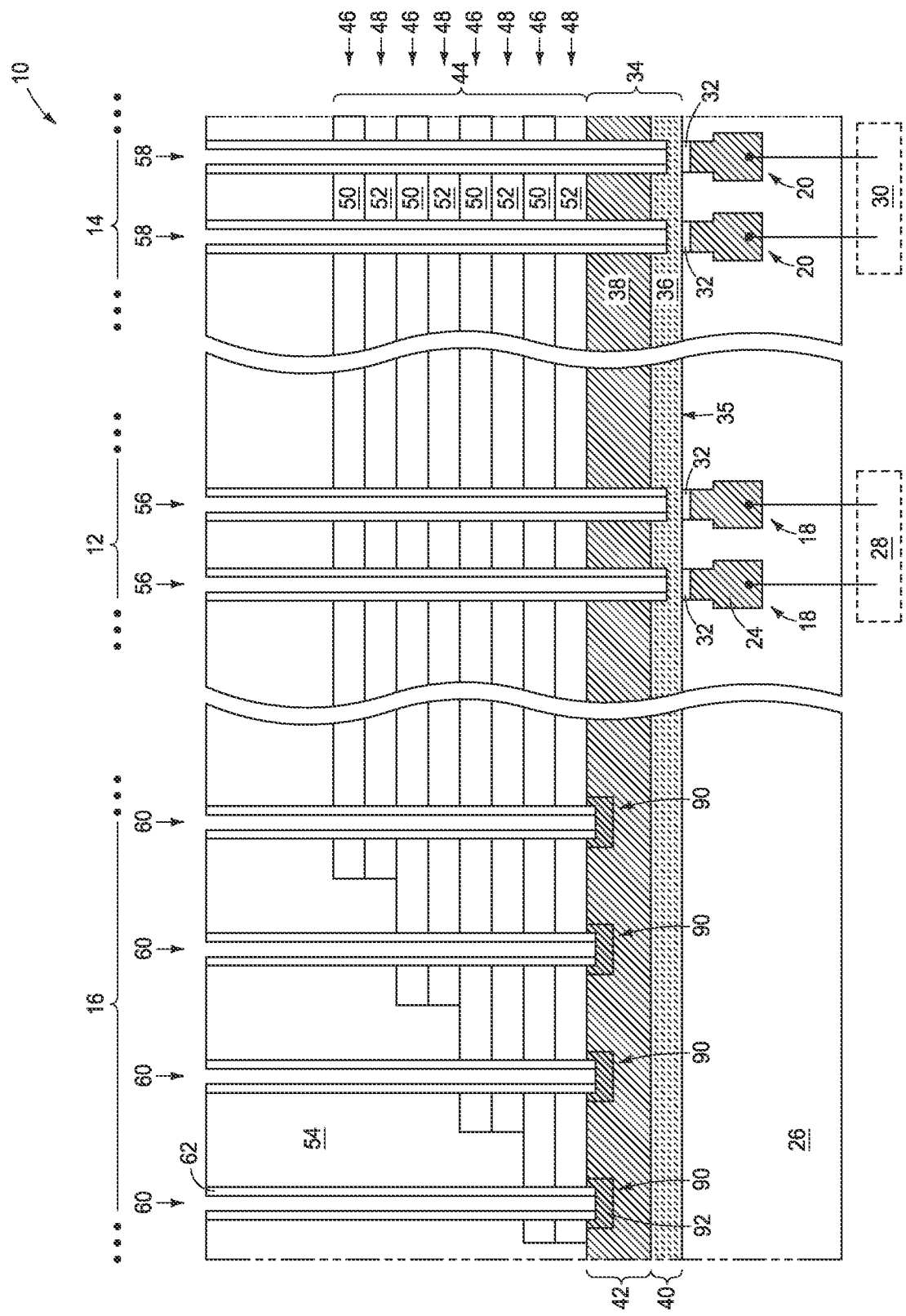

Referring to FIG. 30, bottom regions of the liner material 62 are removed with processing analogous to that described above with reference to FIG. 13.

Figure 31:
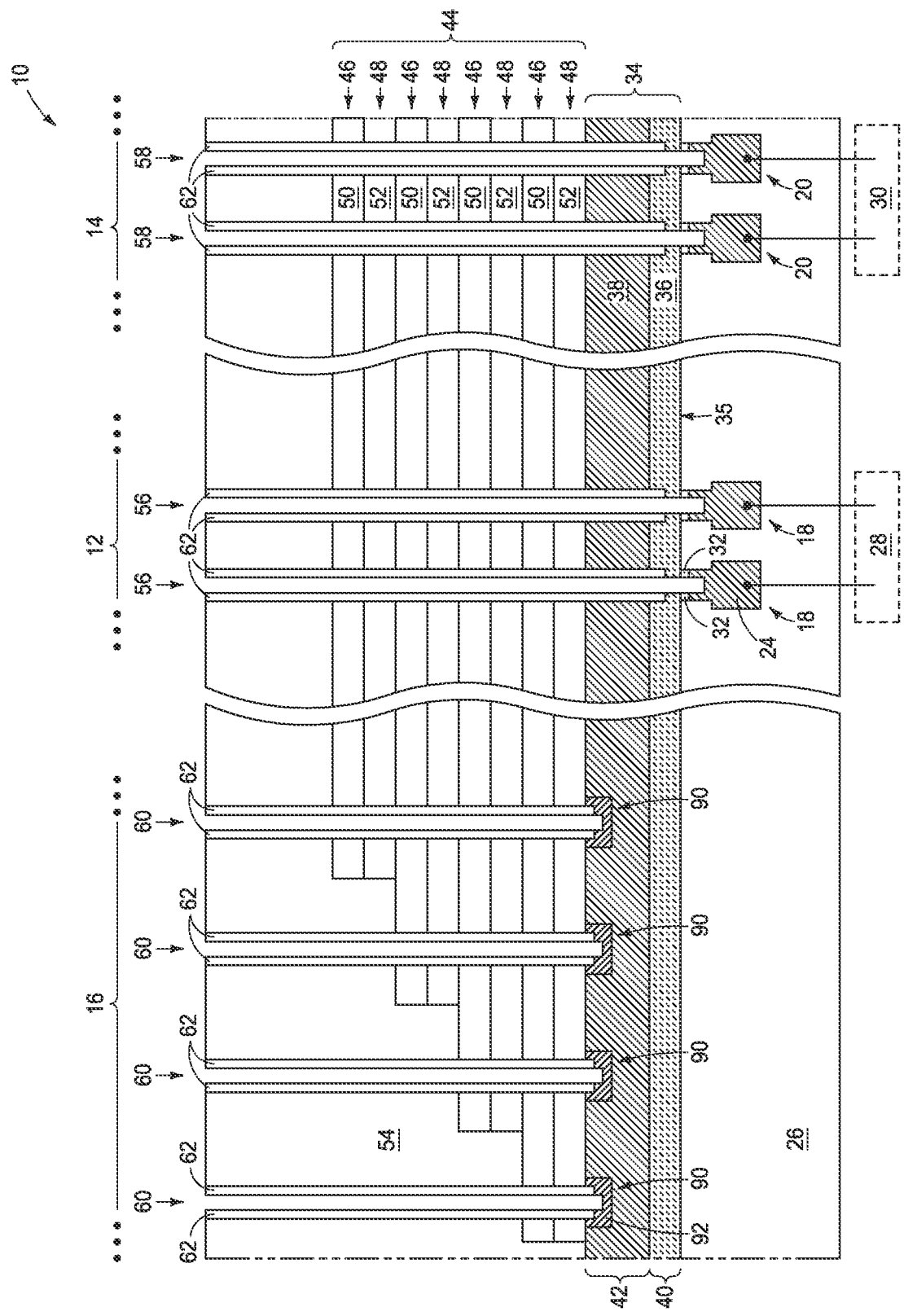

Referring to FIG. 31, the openings 56, 58 and 60 are extended into the conductive material 24 of the nodes 18 and 20; and are extended into the stopping material 92. In the illustrated embodiment, the openings 60 extend a shorter distance into the stopping material 92 than the openings 56 and 58 extend into the materials 36, 32 and 24. In other embodiments, the openings 60 may extend about the same distance into the stopping material 92 as the openings 56 and 58 extend into the materials 36, 32 and 34; or the openings 60 may extend further into the stopping material 92 than the openings 56 and 58 extend into the materials 36, 32 and 24. The amount to which the openings extend into the stopping material 92 may be tailored by choosing appropriate composition(s) for the stopping material 92. Also, the thickness of the stopping material 92 may be tailored to accommodate the distance to which the openings 60 will extend into the stopping material.

Figure 32:
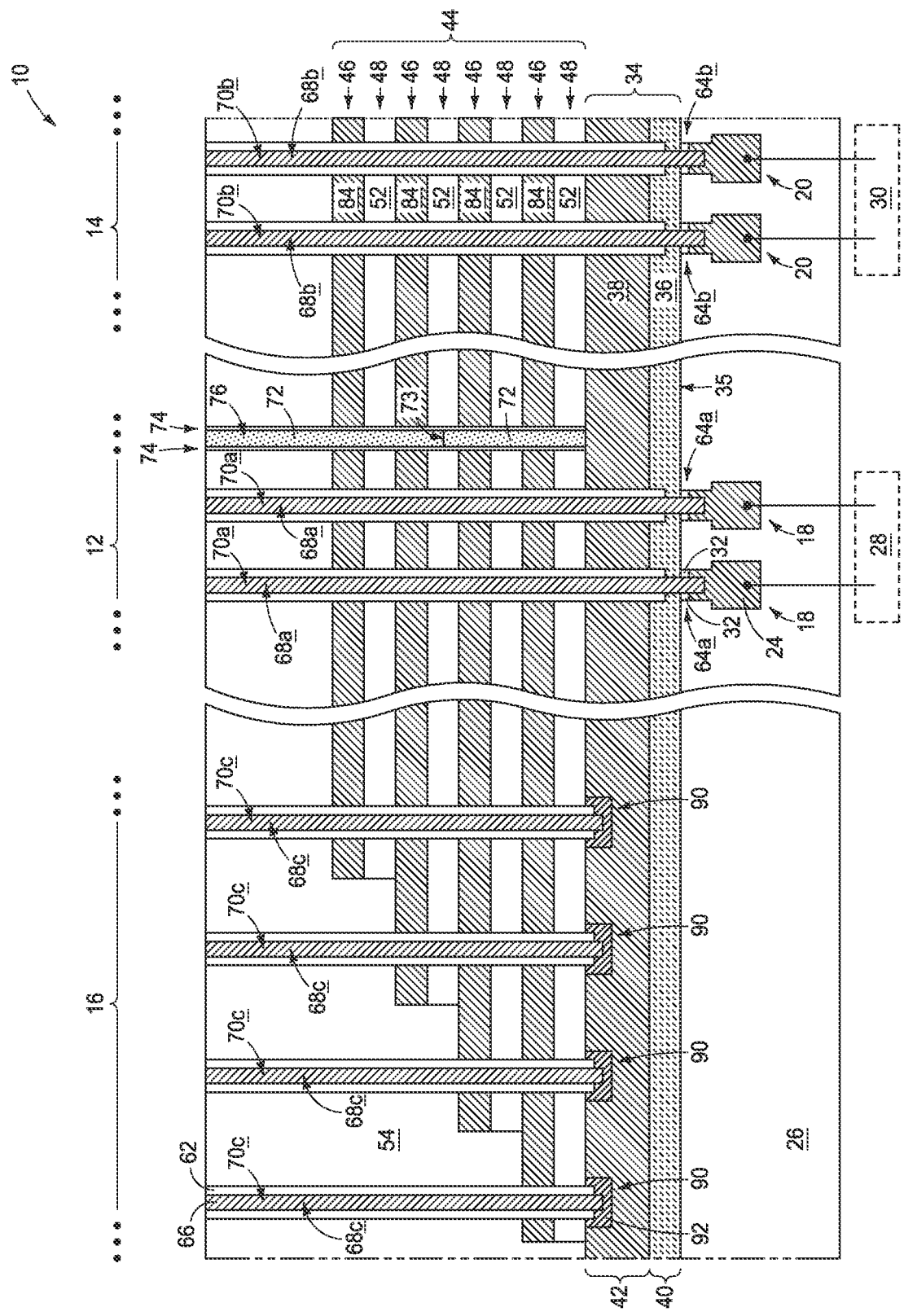

Referring to FIG. 32, the conductive material 66 is formed within the openings 56, 58 and 60 (FIG. 31) to form the conductive pillars 68 of the pillar structures 70. FIG. 32 also shows that the conductive wordline material 84 is formed along the levels 46, and the channel-material-structure 76 is formed within the memory array region 12. Accordingly, the construction 10 of FIG. 32 may comprise a NAND assembly.

Figure 33:
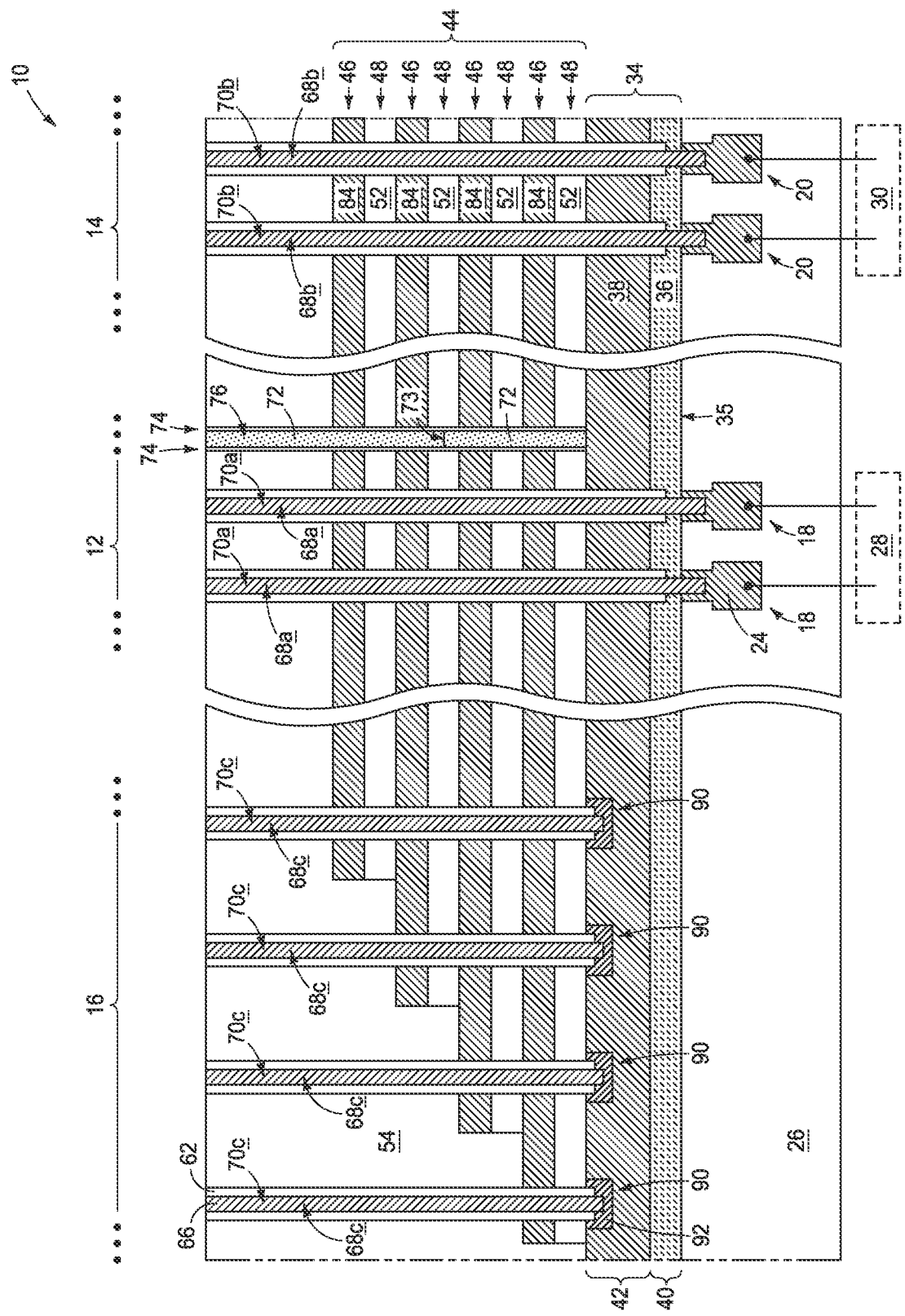
FIG. 33 is a diagrammatic cross-sectional side view of a region of an integrated assembly at a process stage alternative to that of FIG. 32.

The embodiment of FIG. 32 has the collars 64a and 64b around lower regions of the pillars 68a and 68b. In other embodiments, the collars may be omitted. For instance, FIG. 33 shows a construction 10 analogous to that of FIG. 32, but lacking the collars 64.

Figure 34:
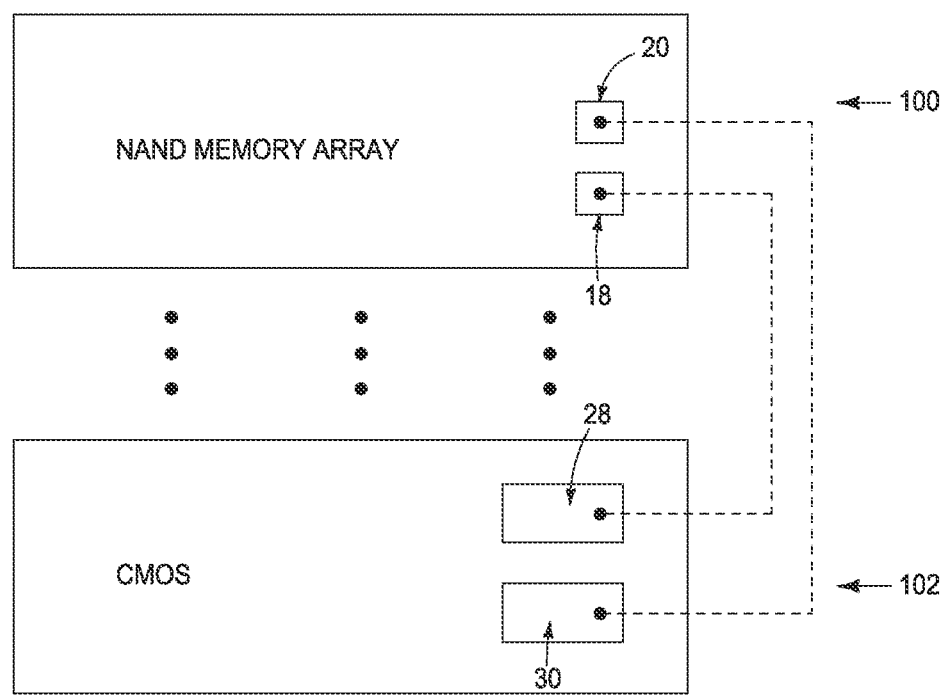
FIG. 34 is a diagrammatic cross-sectional side view of a region of an integrated assembly comprising multiple tiers.

As discussed previously, in some embodiments the NAND assemblies described above may be within a first tier, and the circuitry 28 and 30 may be within a second tier. FIG. 34 diagrammatically illustrates an example configuration having two tiers vertically stacked one atop another. The NAND memory array is within the upper tier 100, and CMOS circuitry is within the lower tier 102. The conductive nodes 18 and 20 are within the upper tier 100, and are electrically coupled with circuitry 28 and 30 within the lower tier. The vertically-stacked arrangement may include additional tiers besides the two shown tiers. The illustrated tiers 100 and 102 may be within different semiconductor dies (wafers), or may be within the same semiconductor die.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a conductive expanse over conductive nodes. The conductive nodes include a first composition. A bottom surface of the conductive expanse includes a second composition which is different composition than the first composition. A stack is over the conductive expanse. The stack includes alternating first and second levels. Pillar structures extend vertically through the stack. Each of the pillar structures includes a post of conductive material laterally surrounded by an insulative liner. The conductive material includes the first composition. One or more of the posts extend through the conductive expanse to directly contact one or more of the conductive nodes.

Some embodiments include an integrated assembly having a conductive expanse over conductive nodes. The conductive nodes comprise a first composition. A bottom surface of the conductive expanse comprises a second composition different from the first composition. A stack is over the conductive expanse. The stack comprises alternating first and second levels. The stack includes a memory array region, a staircase region adjacent the memory array region, and a peripheral region adjacent the memory array region. A first set of the conductive nodes is under the memory array region. Pillar structures extend vertically through the stack. Each of the pillar structures comprises a post of conductive material laterally surrounded by an insulative liner. A first set of the pillar structures extends through the memory array region. A second set of the pillar structures extends through the peripheral region. A third set of the pillar structures extends through the staircase region. The posts of the first set of the pillar structures extend through the conductive expanse to directly contact the first set of the conductive nodes.

Some embodiments include a method of forming an assembly. A construction is formed to have a conductive expanse over conductive nodes. The conductive nodes comprise a conductive first material. The conductive expanse comprises a conductive third material over a conductive second material. The first, second and third materials are compositionally different from one another. A stack of alternating first and second levels is formed over the conductive expanse. The first levels comprise silicon nitride, and the second levels comprise silicon dioxide. The stack includes a memory array region, a staircase region adjacent the memory array region, and a peripheral region adjacent the memory array region. A first set of the conductive nodes is under the memory array region. Openings are formed to extend through the stack and into the conductive expanse. A first set of the openings extends through the memory array region. A second set of the openings extends through the peripheral region. A third set of the openings extends through the staircase region. The openings are lined with insulative material. Bottoms of the lined openings are punched through. The punching through the bottoms of the lined openings includes punching through the bottoms of the openings of the first set to expose the conductive first material of the conductive nodes of the first set. After punching through the bottoms of the lined openings, a conductive fourth material is formed within the lined openings. The fourth material within the lined openings is configured as conductive posts. A first set of the conductive posts extends through the memory array region. A second set of the conductive posts extends through the peripheral region. A third set of the conductive posts extends through the staircase region. The conductive posts of the first set directly contact the conductive nodes of the first set. The silicon nitride of the first levels is removed to leave voids. Conductive wordline material is formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an assembly, comprising:
    forming a construction having a conductive expanse over conductive nodes; the conductive nodes comprising a conductive first material; the conductive expanse comprising a conductive third material over a conductive second material; the first, second and third materials being compositionally different from one another;
    forming a stack of alternating first and second levels over the conductive expanse; the first levels comprising silicon nitride, and the second levels comprising silicon dioxide; the stack including a memory array region, a staircase region adjacent the memory array region, and a peripheral region adjacent the memory array region; a first set of the conductive nodes being under the memory array region;
    forming openings to extend through the stack and into the conductive expanse; a first set of the openings extending through the memory array region, a second set of the openings extending through the peripheral region, and a third set of the openings extending through the staircase region;
    lining the openings with insulative material;
    punching through bottoms of the lined openings; the punching through the bottoms of the lined openings including punching through the bottoms of the openings of the first set to expose the conductive first material of the conductive nodes of the first set;
    after the punching through the bottoms of the lined openings, forming a conductive fourth material within the lined openings; the fourth material within the lined openings being configured as conductive posts; a first set of the conductive posts extending through the memory array region, a second set of the conductive posts extending through the peripheral region, and a third set of the conductive posts extending through the staircase region;
    the conductive posts of the first set directly contacting the conductive nodes of the first set;
    removing the silicon nitride of the first levels to leave voids; and
    forming conductive wordline material within the voids.

2. The method of claim 1 wherein the fourth material is a same composition as the first material.

3. The method of claim 2 wherein the first and fourth materials both consist of tungsten.

4. The method of claim 1 comprising:
    forming a fifth material over the conductive nodes of the first set prior to forming the conductive expanse, and forming the first material of the conductive expanse directly against the fifth material; the fifth material being a different composition than the first, second, third and fourth materials;
extending the openings of the first set through the fifth material during the exposing of the first conductive material of the conductive nodes of the first set; the fifth material remaining as collars along lower regions of the openings of the first set; and
wherein the conductive posts of the first set have regions which are laterally surrounded by the collars.

5. The method of claim 4 wherein a second set of the conductive nodes is under the peripheral region, and comprising:
forming the fifth material over the conductive nodes of the second set simultaneously with the forming of the fifth material over the first set of the conductive nodes;
extending the openings of the second set through the fifth material to expose the first conductive material of the conductive nodes of the second set; the fifth material remaining as a second set of the collars along lower regions of the openings of the second set; and
wherein the conductive posts of the second set have regions which are laterally surrounded by the collars of the second set.

6. The method of claim 5 wherein a third set of the conductive nodes is under the staircase region, and comprising:
forming the fifth material over the conductive nodes of the third set simultaneously with the forming of the fifth material over the first and second sets of the conductive nodes;
extending the openings of the third set through the fifth material to expose the first conductive material of the conductive nodes of the third set; the fifth material remaining as a third set of the collars along lower regions of the openings of the third set; and
wherein the conductive posts of the third set have regions which are laterally surrounded by the collars of the third set.

7. The method of claim 6 wherein the forming of the fifth material over the conductive nodes of the first, second and third sets comprises:
recessing upper surfaces of the conductive nodes of the first, second and third sets relative to an upper surfaces of an insulative support material adjacent the conductive nodes;
forming a layer of the fifth material over the insulative support material and across the recessed upper surfaces;
utilizing a planarization process to remover the fifth material from over the insulative support material while leaving remaining regions of the fifth material over the recessed upper surfaces; the planarization process forming a planarized surface extending across the insulative support material and the remaining regions of the fifth material; and
forming the conductive expanse on the planarized surface.

8. The method of claim 7 wherein:
the first material consists essentially of tungsten;
the second material comprises tungsten silicide;
the third material comprises conductively-doped silicon;
the fourth material consists essentially of tungsten; and
the fifth material comprises titanium nitride.

9. The method of claim 1 wherein the punching through the bottoms of the openings of the first set punches into the conductive first material of the conductive nodes of the first set.

10. The method of claim 1 wherein the openings are formed to extend into the second material, and are then lined with the insulative material.

11. The method of claim 10 wherein:
a second set of the conductive nodes is under the peripheral region;
a third set of the conductive nodes is under the staircase region;
the second set of the conductive nodes is under the conductive expanse;
the third set of the conductive nodes is within the second material of the conductive expanse;
the second and third sets of the conductive nodes comprise the first material;
the conductive posts of the second set directly contacting the conductive nodes of the second set; and
the conductive posts of the third set directly contacting the conductive nodes of the third set.

12. A method of forming an integrated assembly, comprising:
forming a conductive expanse over conductive nodes; the conductive nodes comprising a first composition; a bottom surface of the conductive expanse comprising a second composition different from the first composition, the bottom surface of the conductive expanse being at an elevation above a base that is greater than or equal to an elevation above the base of an uppermost surface the conductive nodes;
forming a stack over the conductive expanse; the stack comprising alternating first and second levels; the stack including a memory array region, a staircase region adjacent the memory array region, and a peripheral region adjacent the memory array region; a first set of the conductive nodes being under the memory array region; and
forming pillar structures extending vertically through the stack; each of the pillar structures comprising a post of conductive material laterally surrounded by an insulative liner, the insulative liner being in direct physical contact with the post of conductive material along an entirety of the post above the conductive expanse and not extending below the bottom surface of the conductive expanse; a first set of the pillar structures extending through the memory array region, a second set of the pillar structures extending through the peripheral region, and a third set of the pillar structures extending through the staircase region; the posts of the first set of the pillar structures extending through the conductive expanse to directly contact the first set of the conductive nodes.

13. The method of claim 12 wherein the first levels comprise conductive wordline material and the second levels are insulative levels.

14. The method of claim 12 further comprising a second set of the conductive nodes under the peripheral region; and wherein the posts of the second set of the pillar structures extend through the conductive expanse to directly contact the second set of the conductive nodes.

15. The method of claim 14 further comprising a third set of the conductive nodes under the staircase region; and wherein the posts of the third set of the pillar structures extend through the conductive expanse to directly contact the third set of the conductive nodes.

16. The method of claim 12 wherein the conductive material of the posts comprises the first composition.

17. The method of claim 12 further comprising forming a first set of collars surrounding regions of the posts of the first set of the pillar structures; said regions being immediately below the bottom surface of the conductive expanse.

* * * * *